US011791142B2

(12) United States Patent
Campbell et al.

(10) Patent No.: US 11,791,142 B2
(45) Date of Patent: Oct. 17, 2023

(54) SMALL GAP DEVICE SYSTEM AND METHOD OF FABRICATION

(71) Applicants: Spark Thermionics, Inc., Berkeley, CA (US); The Trustees of the University of Pennsylvania, Philadelphia, PA (US)

(72) Inventors: Matthew Campbell, Philadelphia, PA (US); Mohsen Azadi, Philadelphia, PA (US); Kyana Van Houten, Berkeley, CA (US); Jared William Schwede, Berkeley, CA (US); Samuel M. Nicaise, Philadelphia, PA (US); Igor Bargatin, Wynnewood, PA (US)

(73) Assignees: Spark Thermionics, Inc., Berkeley, CA (US); The Trustees of the University of Pennsylvania, Philadelphia, PA (US)

( * ) Notice: Subject to any disclaimer, the term of this patent is extended or adjusted under 35 U.S.C. 154(b) by 463 days.

(21) Appl. No.: 17/155,638

(22) Filed: Jan. 22, 2021

(65) Prior Publication Data
US 2022/0139687 A1    May 5, 2022

Related U.S. Application Data

(60) Provisional application No. 63/106,268, filed on Oct. 27, 2020, provisional application No. 63/024,873, (Continued)

(51) Int. Cl.
*H01J 45/00* (2006.01)
*H01J 9/18* (2006.01)
(Continued)

(52) U.S. Cl.
CPC .............. *H01J 45/00* (2013.01); *H01J 9/185* (2013.01); *H01L 29/6653* (2013.01); *H01L 29/6656* (2013.01); *H10N 10/00* (2023.02)

(58) Field of Classification Search
CPC ..... H01L 35/00; H01L 37/00; H01L 29/6656; H01J 45/00; H01J 9/185
(Continued)

(56) References Cited

U.S. PATENT DOCUMENTS 3,173,032 A * 3/1965 Maynard ................. H01J 45/00
310/306
3,312,840 A * 4/1967 Gabor ..................... F23D 14/66
976/DIG. 417
(Continued)

FOREIGN PATENT DOCUMENTS

CN     101268406 A    9/2008
JP     H07322659 A    12/1995
(Continued)

OTHER PUBLICATIONS

International Search Report and Written OPinion for PCT Application No. PCT/US2018/043541 dated Oct. 4, 2018.
(Continued)

*Primary Examiner* — Maged M Almawri
(74) *Attorney, Agent, or Firm* — Jeffrey Schox; Samuel Rosenthal

(57) ABSTRACT

A small-gap device system, preferably including two or more electrodes and one or more spacers maintaining a gap between two or more of the electrodes. A spacer for a small-gap device system, preferably including a plurality of legs defining a mesh structure. A method of spacer and/or small-gap device fabrication, preferably including: defining lateral features, depositing spacer material, selectively removing spacer material, separating the spacer from a fabrication substrate, and/or assembling the small-gap device.

20 Claims, 15 Drawing Sheets

Related U.S. Application Data filed on May 14, 2020, provisional application No. 62/964,980, filed on Jan. 23, 2020.

(51) Int. Cl.
  *H01L 29/66* (2006.01)
  *H10N 10/00* (2023.01)

(58) Field of Classification Search
  USPC .......................... 310/305, 306; 136/206, 208
  See application file for complete search history.

(56) References Cited

U.S. PATENT DOCUMENTS

| | | | | |
|---|---|---|---|---|
| 5,459,367 | A | * | 10/1995 | Davis ...................... H01J 45/00 310/306 |
| 5,783,893 | A | * | 7/1998 | Dade ...................... H02K 16/00 310/266 |
| 7,129,616 | B2 | * | 10/2006 | Davis ...................... H01J 45/00 310/306 |
| 7,427,786 | B1 | * | 9/2008 | Cox ....................... H10N 15/00 257/729 |
| 9,124,161 | B2 | * | 9/2015 | Kim ....................... H02K 1/278 |
| 10,147,860 | B2 | * | 12/2018 | Ghoshal ................. H10N 10/13 |
| 10,790,403 | B1 | * | 9/2020 | Winn .................... H01L 31/048 |
| 11,170,984 | B2 | | 11/2021 | Schwede et al. |
| 2002/0127495 | A1 | * | 9/2002 | Scherer .................... G03F 7/16 430/5 |
| 2004/0108781 | A1 | * | 6/2004 | Razzell ................. H02K 51/00 310/112 |
| 2005/0016575 | A1 | * | 1/2005 | Kumar ................... H10N 10/00 136/205 |
| 2009/0161058 | A1 | * | 6/2009 | Sherman ............... B32B 27/281 349/153 |
| 2011/0100749 | A1 | * | 5/2011 | Nonogi ................... B32B 27/12 181/291 |
| 2011/0316366 | A1 | * | 12/2011 | Abbasian ............. H02K 19/103 310/46 |
| 2012/0153772 | A1 | * | 6/2012 | Landa ..................... C23C 14/34 428/221 |
| 2014/0217859 | A1 | * | 8/2014 | Saito ...................... H02K 1/276 310/68 D |
| 2016/0017786 | A1 | * | 1/2016 | Kimura ................. F01N 13/146 60/320 |
| 2017/0183772 | A1 | * | 6/2017 | Bargatin ............... H01J 37/321 |
| 2019/0027347 | A1 | * | 1/2019 | Schwede ................. H01J 45/00 |

FOREIGN PATENT DOCUMENTS

| | | |
|---|---|---|
| KR | 20080040718 A | 5/2008 |
| WO | 2007010414 A2 | 1/2007 |

OTHER PUBLICATIONS

Bellucci, Alessandro, et al., "Dielectric Micro- and Sub-Micrometric Spacers for High-Temperature Energy Converter", Energy Technology. 2020, 2000788.

Campbell, Matthew, et al., "Achieving ultrahigh thermal resistance across micron-sized gaps", Spark Thermionics, University of Pennsylvania, presented Oct. 28, 2019.

Costescu, R.M., et al., "Ultra-Low Thermal Conductivity in W/Al2O3 Nanolaminates", Science, Feb. 13, 2004: vol. 303, Issue 5660, pp. 989-990.

Desutter, John, et al., "A near-field radiative heat transfer device", Nature Nanotechnology vol. 14, pp. 751-755(2019).

Fitzpatrick, G., et al., "Demonstration of close-spaced thermionic converters" Proceeding 28th IECEC, 573-580 (1993).

Ito, Kota, et al., "Dynamic Modulation of Radiative Heat Transfer beyond the Blackbody Limit", Nano Lett. 2017, 17, 7, 4347-4353, Publication Date:Jun. 8, 2017, https://doi.org/10.1021/acs.nanolett. 7b01422.

Karalis, A., et al., "'Squeezing' near-field thermal emission for ultra-efficient high-power thermophotovoltaic conversion", Scientific Reports 6, 28472 (2016).

Lang, S., et al., "Dynamic measurement of near-field radiative heat transfer", Scientific Reports vol. 7, Article No. 13916 (2017).

Lee, S.W., et al., "A micro cell lysis device", Sensors and Actuators. A: Physical. 73(1-2), 74-79 (1999).

Lee, J.H., et al., "Optimal emitter-collector gap for thermionic energy converters", Applied Physics Letters 100, 173904 (2012).

Nicaise, Samuel, et al., "Micron-gap spacers with ultrahigh thermal resistance and mechanical robustness for direct energy conversion", Microsystems & Nanoengineering vol. 5, Article No. 31 (2019).

Radmilović-Radjenović, M., et al., "Breakdown voltage curves in direct current discharges in molecular gases at microgaps", Micro & Nano Letters 7(3), 232-234 (2012).

\* cited by examiner

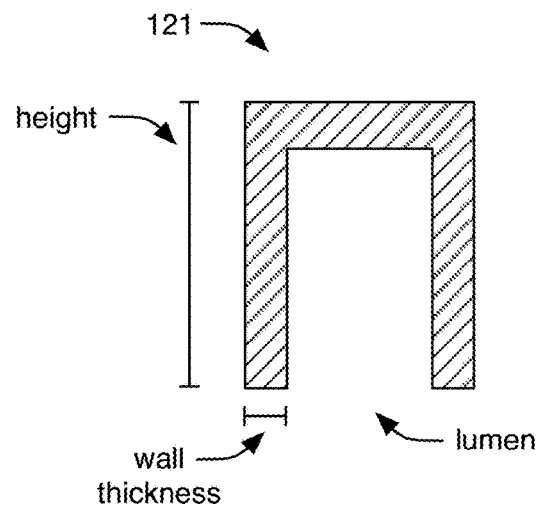
FIGURE 5A
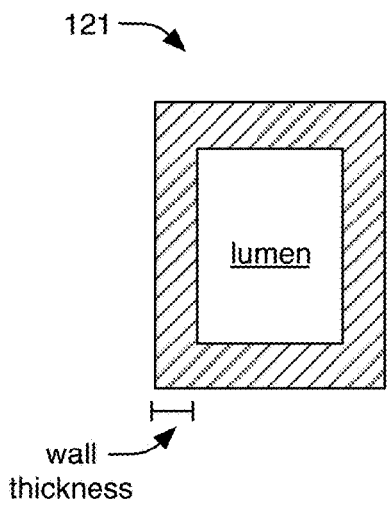
FIGURE 5B
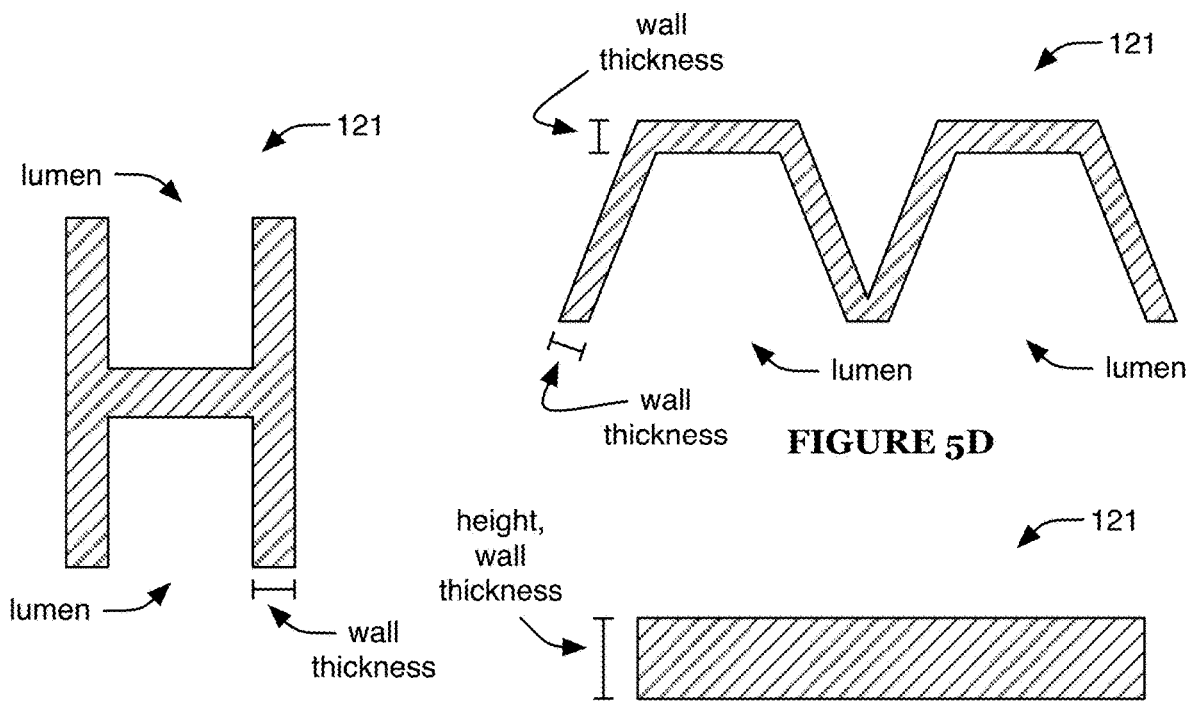
FIGURE 5C
FIGURE 5D
FIGURE 5E

SMALL GAP DEVICE SYSTEM AND METHOD OF FABRICATION

CROSS-REFERENCE TO RELATED APPLICATIONS

This application claims the benefit of U.S. Provisional Application Ser. No. 62/964,980, filed 23 Jan. 2020, U.S. Provisional Application Ser. No. 63/024,873, filed 14 May 2020, and U.S. Provisional Application Ser. No. 63/106,268, filed 27 Oct. 2020, each of which is incorporated in its entirety by this reference.

STATEMENT OF GOVERNMENT SUPPORT

This invention was made with government support under Contract Number W911NF-18-C-0057 awarded by the Defense Advanced Research Projects Agency and Award Number FA864920P0325 awarded by the Department of the Air Force. The government has certain rights in the invention.

TECHNICAL FIELD

This invention relates generally to the small-gap device field, and more specifically to a new and useful spacer system in the small-gap device field.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. System.

Figure 1A:
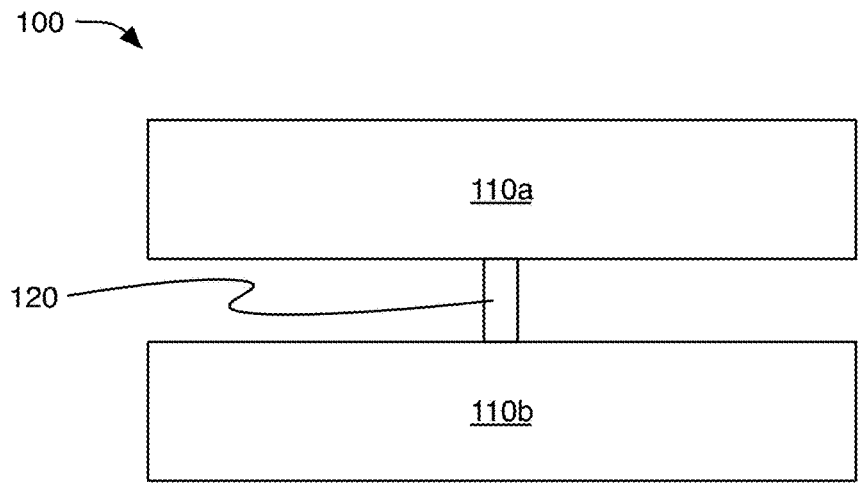
FIG. 1A is a side view of an embodiment of the system.
Figure 1B:
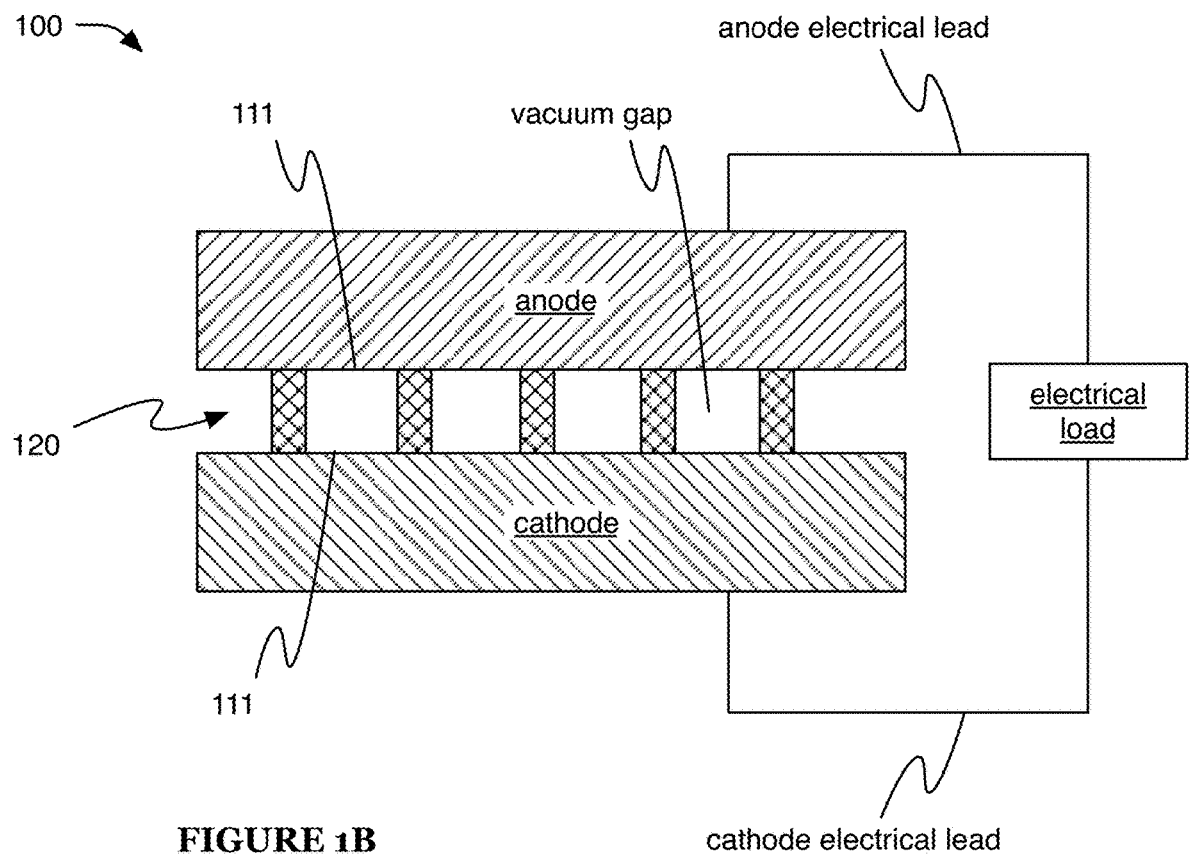
FIG. 1B is a cross-sectional side view of a variant of the embodiment.

A small-gap device system 100 preferably includes two or more electrodes 110 and one or more spacers 120. The electrodes 110 are preferably separated (e.g., defining a small inter-electrode gap, such as a micron-scale gap) by the spacer(s) 120, such as shown in FIGS. 1A-1B. The system 100 preferably includes one or more elements such as described in U.S. patent application Ser. No. 16/044,215, filed 24 Jul. 2018, and titled "Small Gap Device System and Method of Fabrication", which is herein incorporated in its entirety by this reference; for example, the system 100 can include the entire 'small-gap device system 100' described in U.S. patent application Ser. No. 16/044,215 (or a subset of elements thereof), optionally with the exception of one or more variations such as described below. However, system can additionally or alternatively include any other suitable elements, and the elements of the system can additionally or alternatively have any other suitable arrangement. The system can be fabricated as described below regarding the method of fabrication, and/or can be fabricated in any other suitable manner.

The system 100 preferably includes (or is part of) a thermionic energy converter (TEC). For example, the electrodes 110 can include a cathode (e.g., operable to emit electrons when at high temperature) and an anode (e.g., operable to collect electrons emitted by the cathode) separated by the spacer(s). The TEC is preferably configured to operate in the vacuum and/or quasi-vacuum mode, but can additionally or alternatively be configured to operate in the Knudsen mode and/or operate in any other suitable manner. However, the system can additionally or alternatively include (or be part of) a thermophotovoltaic device, microgap plasma device, bio-sensing and/or bio-manipulation device, and/or any other suitable type of device (e.g., devices that require and/or may benefit from a small gap, thermal isolation, and/or electrical isolation between the electrodes; other devices).

1.1 Materials.

The elements of the system can include (e.g., be made of) any suitable materials and/or combinations of materials. The materials can include semiconductors, metals, insulators, organic compounds (e.g., polymers, small organic molecules, etc.), and/or any other suitable material types.

The semiconductors can include group IV semiconductors, such as Si, Ge, SiC, and/or alloys thereof; III-V semiconductors, such as GaSb, GaAs, GaP, GaN, AlSb, AlAs, AlP, AlN, InSb, InAs, InP, InN, and/or alloys thereof; II-VI semiconductors, such as ZnTe, ZnSe, ZnS, ZnO, CdSe, CdTe, CdS, MgSe, MgTe, MgS, and/or alloys thereof; and/or any other suitable semiconductors.

The metals can include alkali metals (e.g., Li, Na, K, Rb, Cs, Fr), alkaline earth metals (e.g., Be, Mg, Ca, Sr, Ba, Ra), transition metals (e.g., Sc, Ti, V, Cr, Mn, Fe, Co, Ni, Cu, Zn, Sn, Zr, Nb, Mo, Au, Ru, Rh, Pd, Ag, Cd, Hf, Ta, W, Re, Ir, Pt, Hg, Al, Si, In, Ga, Tl, Pb, Bi, Sb, Te, Sm, Tb, Ce, Nd), post-transition metals (e.g., Al, Zn, Ga, Ge, Cd, In, Sn, Sb, Hg, Tl, Pb, Bi, Po, At), metalloids (e.g., B, As, Sb, Te, Po), rare earth elements (e.g., lanthanides, actinides), synthetic elements (e.g., Am, Cm, Bk, Cf, Es, Fm, Md, No, Lr, Rf, Db, Sg, Bh, Hs, Mt, Ds, Rg, Cn, Nh, Fl, Mc, Lv, Ts), any other suitable metal elements, and/or any suitable alloys, compounds, and/or other mixtures of the metal elements.

The insulators can include any suitable insulating (and/or wide-bandgap semiconducting) materials. For example, insulators can include insulating metal and/or semiconductor compounds, such as oxides, nitrides, oxynitrides, fluorides, borides, and/or any other suitable compounds.

The elements of the system can include any suitable alloys, compounds, and/or other mixtures of materials (e.g., the materials described above, other suitable materials, etc.), in any suitable arrangements (e.g.; multilayers; superlattices; having microstructural elements such as inclusions, dendrites, lamina, etc.).

1.2 Electrodes.

The system 100 can include electrodes 110 such as described in U.S. patent application Ser. No. 16/044,215, filed 24 Jul. 2018, and titled "Small Gap Device System and Method of Fabrication", which is herein incorporated in its entirety by this reference, and/or can include any other suitable electrodes. Although the electrodes preferably include electrical conductors, a person of skill in the art will understand that variants of the system can additionally or alternatively include any other suitable device elements (e.g., flat and/or planar elements), having any suitable properties, arranged along with and/or in place of the electrodes. For example, an embodiment of the system (e.g., a thermophotovoltaic device embodiment) can include an optical emission element and a photovoltaic cell (e.g., in place of electrodes) separated by a spacer.

1.3 Spacer.

The spacer 120 (or spacers) preferably includes one or more elements such as described in U.S. patent application Ser. No. 16/044,215, filed 24 Jul. 2018, and titled "Small Gap Device System and Method of Fabrication", which is herein incorporated in its entirety by this reference; for example, the spacer 120 can include one or more spacers (or elements thereof) as described in U.S. patent application Ser. No. 16/044,215, optionally with the exception of one or more variations such as described below in more detail (e.g., variations regarding materials, cross-sections, protrusions, surface textures, and/or any other suitable characteristics).

The spacer 120 (or spacers) preferably functions to maintain the inter-electrode gap (e.g., prevent contact between the inner surfaces of the electrodes), more preferably without providing significant thermal and/or electrical conduction between the electrodes (e.g., electrically and/or thermally isolating the first electrode from the second electrode). Low thermal and/or electrical conductance can arise due to spacer material properties, spacer dimensions, contact resistances, prevention and/or mitigation of parasitic surface conduction (e.g., by increasing surface conduction path lengths between the electrodes, by decreasing surface adsorption of species that may contribute to surface conductivity, etc.), and/or any other suitable factors.

The spacer 120 preferably defines a high geometrical transparency, which can enable significant transport (e.g., of electrons, atoms, and/or light) between the electrodes (e.g., minimal transport reduction as compared with a spacer-free device). The spacer 120 is preferably arranged throughout the region of the inter-electrode gap, but can alternatively be arranged within any suitable sub-regions of the gap (and/or have any other suitable arrangement within the system).

In some embodiments, significant forces may be exerted on the spacer 120 (e.g., compressive forces, such as compressive forces exerted substantially normal the inner surfaces; shear forces, such as forces arising from vibration, impacts, and/or differential thermal expansion; etc.), and the spacer 120 preferably withstands such forces. For example, some or all of the inter-electrode gap can be fluidly isolated from the ambient environment surrounding the system, and can be held at lower pressure than the ambient environment (e.g., can be a vacuum environment). In this example, significant pressure (e.g., substantially equal to atmospheric pressure) may be exerted on the electrodes (e.g., if portions of the electrodes, such as an outer electrode surface opposing the inner electrode surface across the electrode, are exposed to the ambient environment) and, via the electrodes, on the spacer. Further, other forces, such as compressive forces arising from differing amounts of thermal expansion of elements of the system and/or from spring forces exerted by other elements of the system, can additionally or alternatively be exerted on the electrodes and/or the spacer. Thus, in this example, the spacer 120 preferably withstands the forces (e.g., maintains the inter-electrode gap while subject to these forces, does not fracture under these forces, etc.).

Figure 2A:
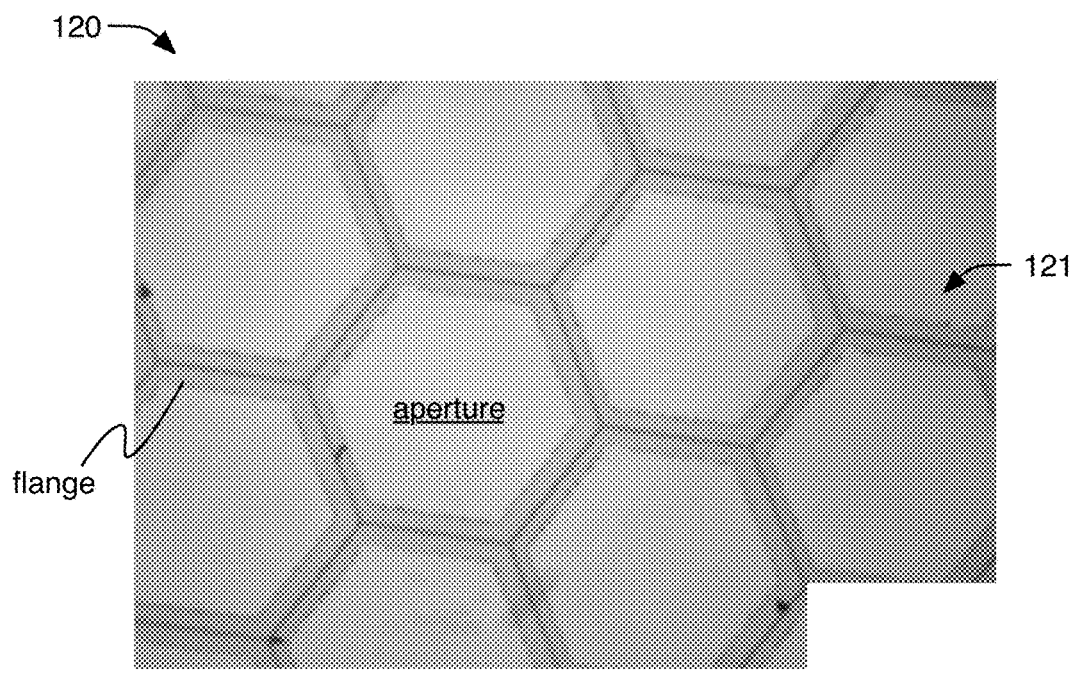
FIGS. 2A-2C, 3A-3D, and 4A-4C are plan views of various examples of a spacer of the system.
Figure 2B:
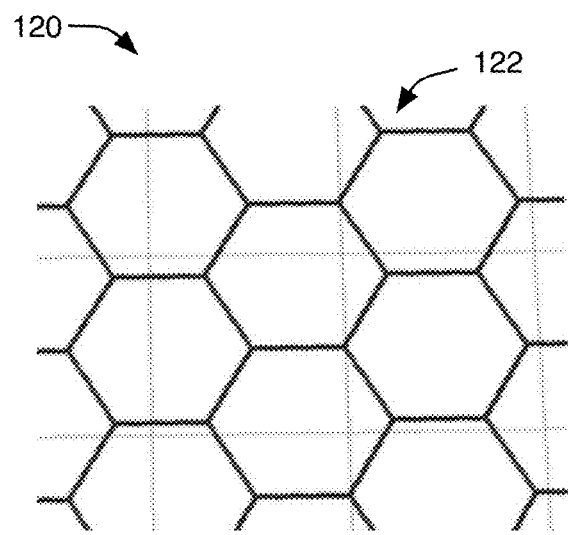
Figure 2C:
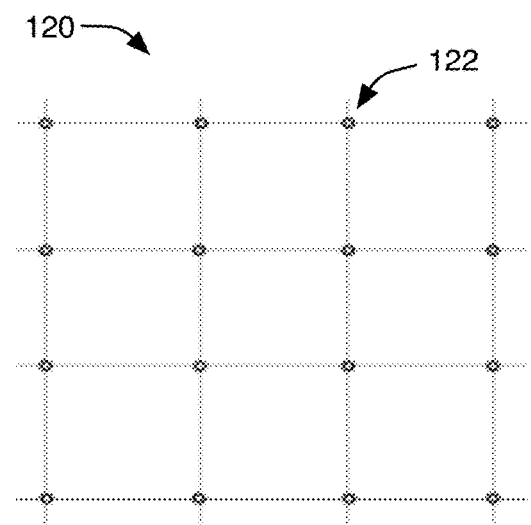
Figure 3A:
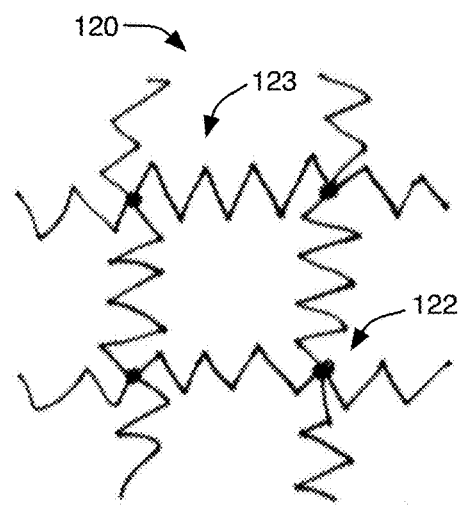
Figure 3B:
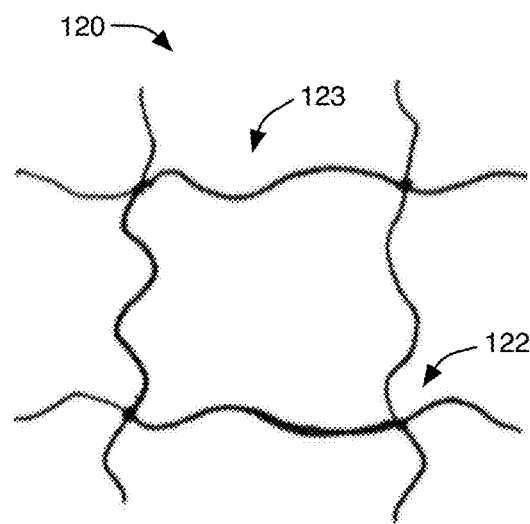
Figure 3C:
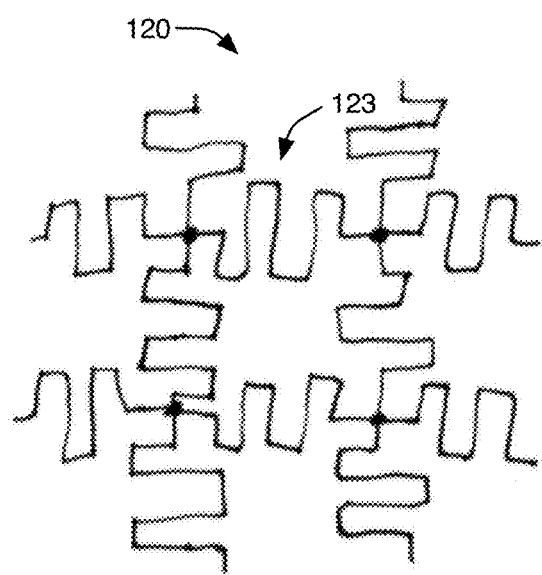
Figure 3D:
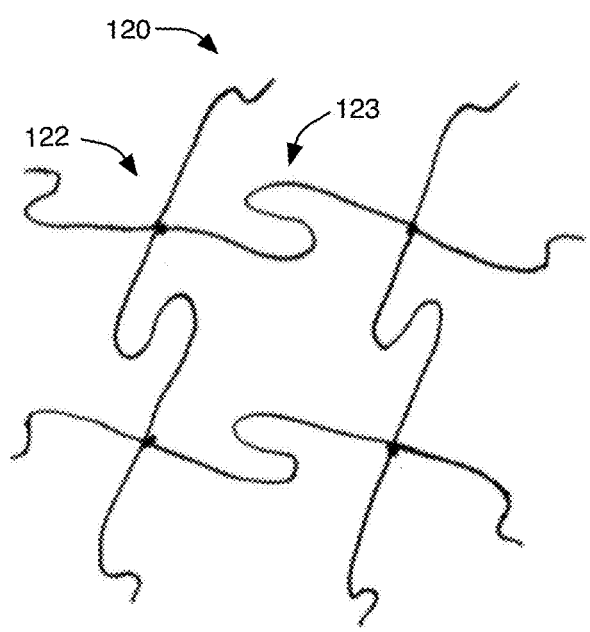

The spacer 120 preferably defines a continuous network (e.g., of elongated legs 121 connected at vertices 122) such as a mesh structure (e.g., including a set of vertices and a set of paths connected between vertices 122 of the set). In some embodiments, the spacer can form a free-standing structure (e.g., structurally robust and/or manipulable without a support substrate), whereas in other embodiments, the spacer may be mechanically coupled (e.g., temporarily connected to) one or more support structures (e.g., as described below in more detail). The spacer 120 (e.g., the vertices 122 and/or legs 121 of the spacer) preferably define (or substantially define) a lattice (e.g., 2-D lattice), such as an array of nodes (e.g., vertices 122, such as vertices defining regular and/or irregular polygons, such as hexagons, rectangles, triangles, etc.) connected by the legs 121 (e.g., as shown in FIGS. 2A-2C). However, the spacer 120 can alternatively define a non-periodic (e.g., aperiodic) tiling, an amorphous structure (e.g., having short-range order but lacking long-range order), a random structure, and/or any other suitable structure.

The spacer 120 preferably defines a plurality of apertures (e.g., between legs 121 of the spacer, such as shown in FIG. 2A), such as apertures for which a vector normal to a first electrode inner surface 111*a* passes through the aperture to the second electrode inner surface 111*b* without intersecting the spacer 120 (and preferably, without intersecting any other elements of the system). For example, high geometric transparency (e.g., as described above) can be achieved through a high ratio of aperture area to leg projected area.

The separation (e.g., lateral separation, such as within a plane substantially parallel to an electrode inner surface) between spacer elements (e.g., legs 121, vertices 122, etc.) is preferably short enough to maintain inter-electrode spacing (e.g., maintain substantially uniform spacing, maintain spacing above a minimum threshold, prevent electrode-electrode contact, etc.) throughout the entire gap (e.g., despite potential inner electrode surface roughness, contamination, non-planarity, and/or mechanical deformation, such as warping and/or bowing arising from thermal stresses, mechanical stresses arising from thermal expansion of other elements of the system, external pressures such as atmospheric pressure, and/or any other suitable forces exerted on the spacer, etc.), wherein the inter-electrode spacing is preferably defined along an axis substantially normal to an electrode inner surface. For example, the elements can be arranged such that circles defined by the elements (e.g., inscribed circles) define diameters and/or radii smaller than a threshold length, and/or distances between vertices 122 (e.g., connected vertices) are less than the threshold length. The threshold length(s) can be absolute amounts (e.g., 0.01 mm, 0.05 mm, 0.1 mm, 0.2 mm, 0.3 mm, 0.4 mm, 0.5 mm, 0.75 mm, 1 mm, 2 mm, 5 mm, etc.), can be defined relative to (e.g., be a percentage of, such as 0.1%, 1%, 2%, 5%, 10%, 20%, 25%, 50%, 100%, 200%, 300%, 500%, 1000%, 5000%, 25,000%, 0.01-0.1%, 0.1-1%, 1-10%, 10-100%, 100-1000%, 1000-10,000%, 10,000-100,000%, etc.) one or more characteristic dimensions of the system (e.g., spacer dimensions, such as height, width, wall thickness, etc.; electrode dimensions, such as diameter, roughness, flatness, etc.), and/or can be defined in any other suitable manner.

The legs 121 are preferably substantially non-linear, but can alternatively be linear. The leg(s) can extend along a non-linear path within a plane parallel the inner surface of the first and/or second electrode (e.g., be non-linear along a lateral or x-y plane); extend along a non-linear path out-ofplane with the plane (e.g., wherein the plane is parallel the inner surface of the first and/or second electrode; wherein the path can intermittently intersect the plane; wherein the legs 121 can be non-linear in an x-z plane and/or y-z plane; etc.); be non-linear in any suitable plane(s) and/or with respect to any suitable axes; and/or be otherwise non-linear.

The legs 121 preferably define non-linear (e.g., circuitous) paths 123 between the vertices 122 (e.g., as shown in FIGS. 3A-3D), more preferably substantially non-linear paths, such as paths defining lengths substantially greater than the linear distance between the path endpoints (e.g., as described below regarding the path length and segment length), and/or paths with curved (e.g., arcuate) elements. The paths 123 can be (or include segments that are) curved, serpentine, boustrophedonic, wavy, helical, meandering, angled, crenate, and/or crenellated, and/or can have any other suitable (e.g., substantially non-linear) shape(s). The non-linear and/or circuitous paths preferably function to increase lateral (e.g., parallel to an inner electrode surface) compliance of the legs, which can enhance spacer robustness to thermal cycling (e.g., robustness to thermal expansion and/or contraction occurring during thermal cycling). The circuitous paths can additionally or alternatively function to increase normal (e.g., normal to the inner electrode surface) strength (e.g., under forces such as described above), such as by increasing a buckling threshold of the legs.

Figure 4A:
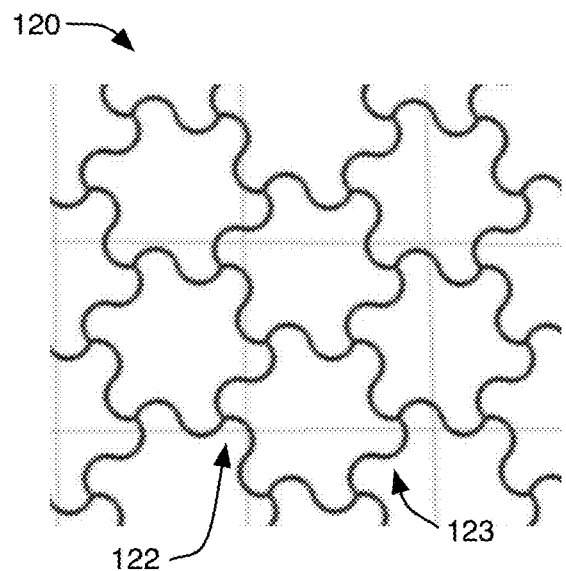
Figure 4B:
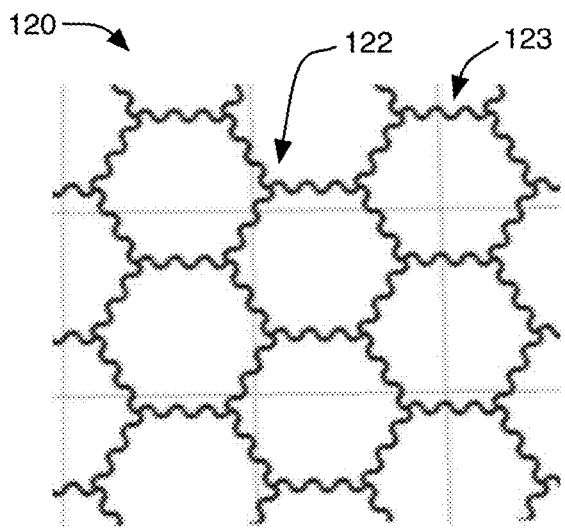
Figure 4C:
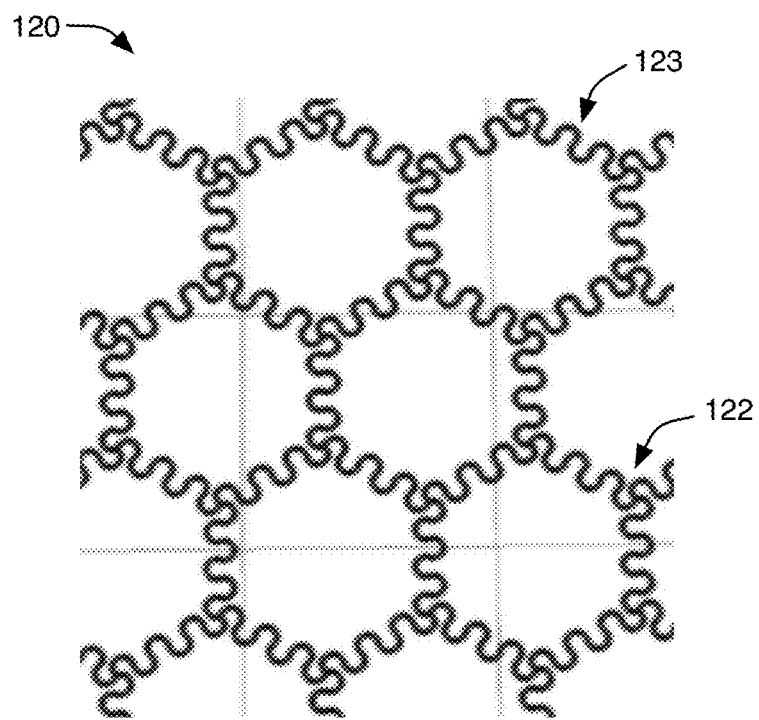

In one example (e.g., as shown in FIGS. 4A-4C), the paths 123 each include a series of circular arcs with alternating curvature directions (preferably lateral curvature, but additionally or alternatively including out-of-plane curvature), preferably connected at their endpoints (e.g., each endpoint lying on a line between the vertices 122) but alternatively separated from each other, such as being connected via straight segments and/or any other suitable segments. The circular arcs can have any suitable radius of curvature (e.g., 1 μm, 5 μm, 10 μm, 15 μm, 22.5 μm, 30 μm, 45 μm, 60 μm, 80 μm, 100 μm, 125 μm, 150 μm, 200 μm, 250 μm, 10-30 μm, 25-75 μm, 70-150 μm, 125-300 μm, greater than 300 μm, less than 1 μm, etc.), any suitable arc angle (e.g., 5°, 10°, 20°, 30°, 45°, 60°, 75°, 90°, 100°, 110°, 120°, 130°, 140°, 150°, 160°, 170°, 180°, 45-75°, 60-100°, 90-150°, 130-180°, greater than 180°, less than 45°, etc.), and/or any other suitable metrics.

Figure 7A:
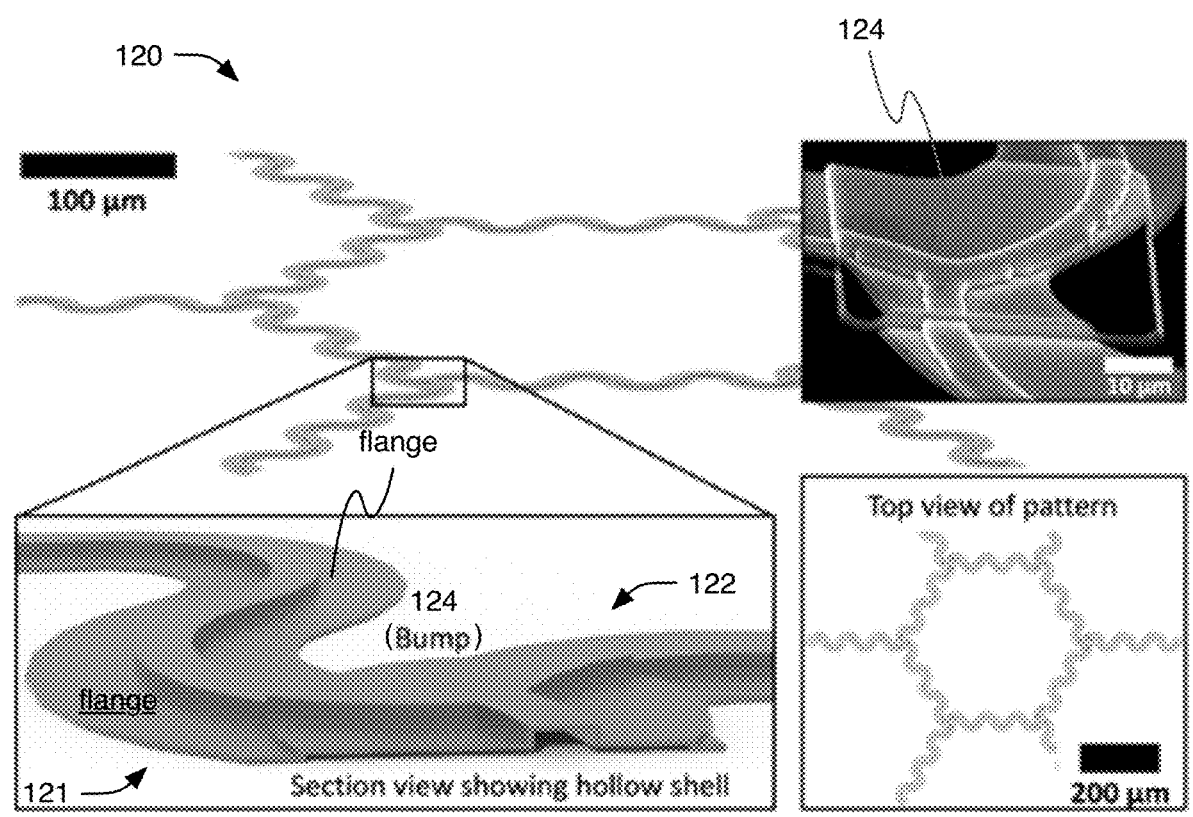
FIGS. 7A-7C are perspective views of various specific examples of the spacer.
Figure 7B:
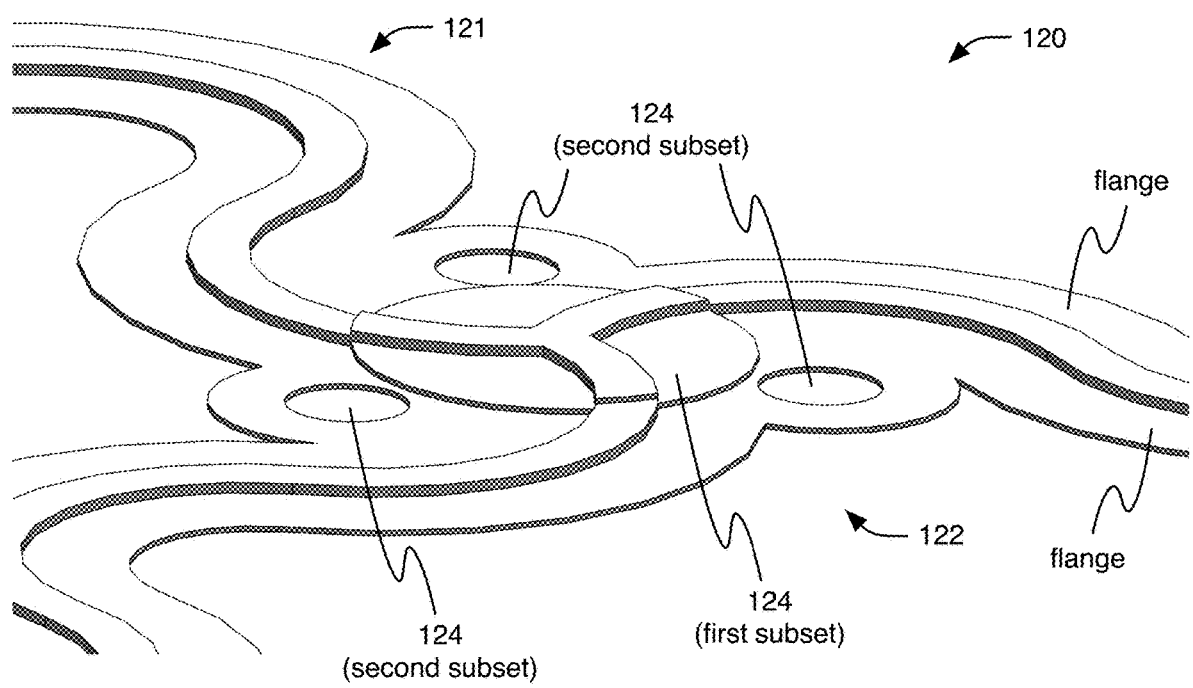
Figure 7C:
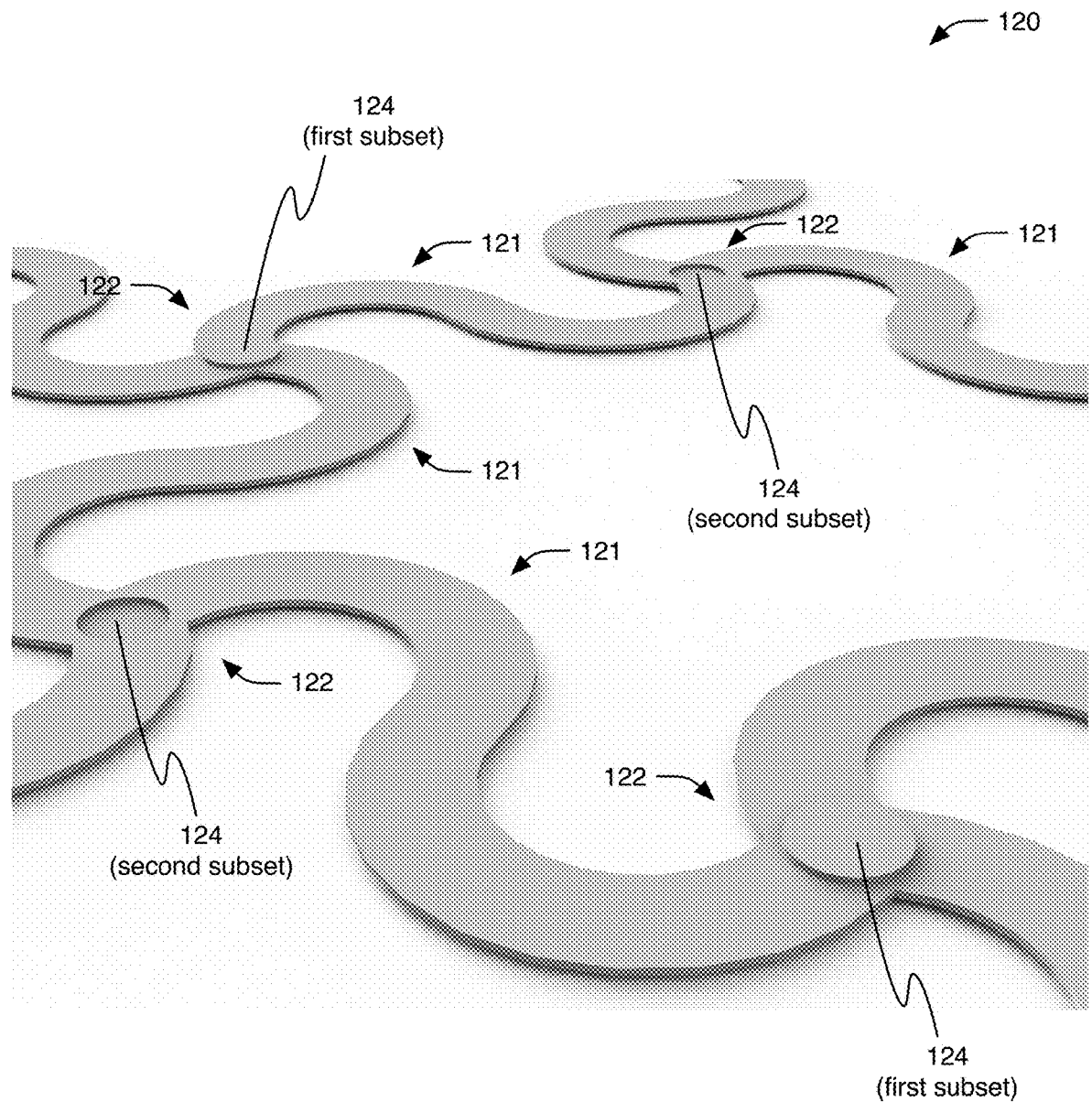

In a second example (e.g., as shown in FIGS. 7A-7C), the paths 123 each include a sinusoidal (and/or semisinusoidal, pseudosinusoidal, etc.) curve. The sinusoids defined by the paths can have any suitable amplitude, which can be defined as an absolute value (e.g., 0.2, 0.5, 1, 2, 3, 4, 5, 6, 8, 10, 15, 20, 30, 0.1-0.3, 0.3-1, 1-3, 2-5, 3-10, and/or 10-30 μm, etc.) and/or defined relative to (e.g., a fractional amount of, such as, 10, 25, 50, 65, 75, 80, 85, 90, 100, 110, 125, 150, 5-25, 25-65, 65-90, 75-85, 90-115, 115-130, and/or 130-200% of, etc.) one or more other leg and/or spacer dimensions (e.g., leg width, leg feature width such as the width of a trough or other feature of the leg cross-section, etc.). The sinusoids can have any suitable periodicity, such as defining a specific number of periods between vertices (e.g., 1, 1.5, 2, 2.5, 3, 3.5, 4, 4.5, 5, 6, 8, 10, 1-2.5, 2-4, 4-6, 6-10, and/or more than 10, etc.) and/or having a period of a particular absolute length (e.g., 2, 5, 8, 10, 13, 15, 20, 25, 30, 40, 1-3, 3-8, 6-10, 10-15, 15-20, 20-30, 30-50, and/or more than 50 μm, etc.). However, the spacer 120 can additionally or alternatively include straight legs 121 directly connecting the vertices 122, and/or legs 121 defining any other suitable paths.

With the exception of one or more protrusions, depressions, and/or other engineered contact points (e.g., as described below in more detail), the legs 121 preferably define a substantially consistent cross-section (e.g., on planes normal the path defined by the leg) along their length (and from leg to leg). However, the legs can alternatively define cross-sections that change (e.g., gradually, in steps, etc.) along the length of the leg and/or between different legs, and/or can define any other suitable cross-section(s). Each leg 121 can be solid, porous, include geometric voids (e.g., lumens), form a matrix, or be otherwise constructed. The leg internal structure can be consistent or variable through the leg length, width, and/or height.

Figure 5F:
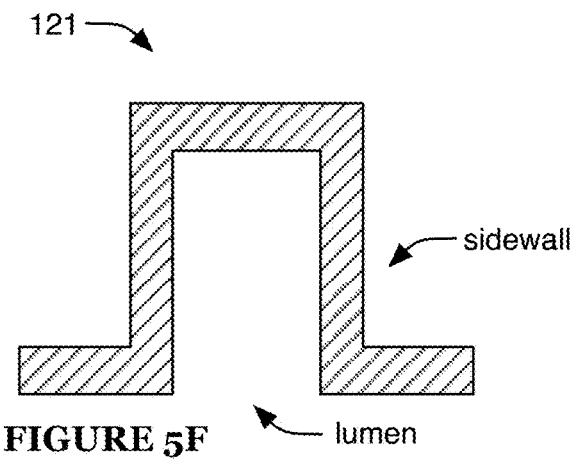
FIGS. 5A-5X are cross-sectional side views of various examples of a leg of the spacer.
Figure 5G:
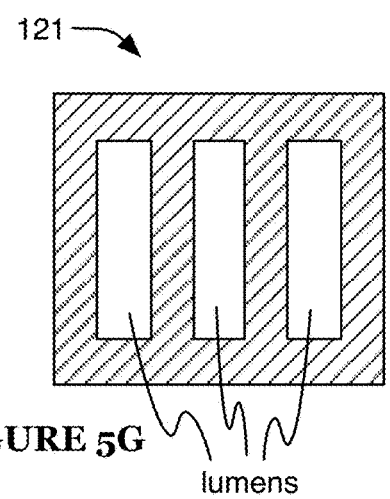
Figure 5H:
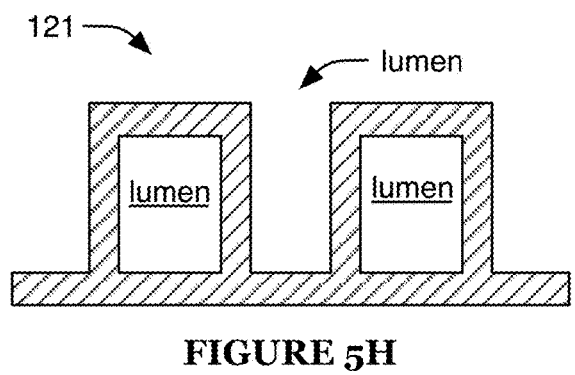
Figure 5I:
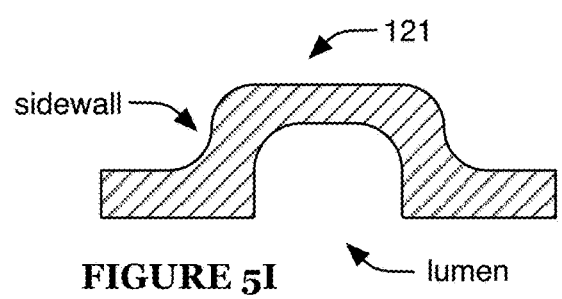
Figure 5J:
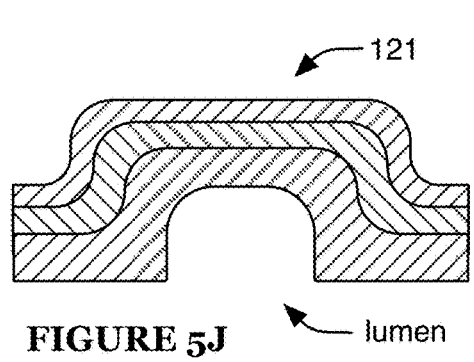
Figure 5K:
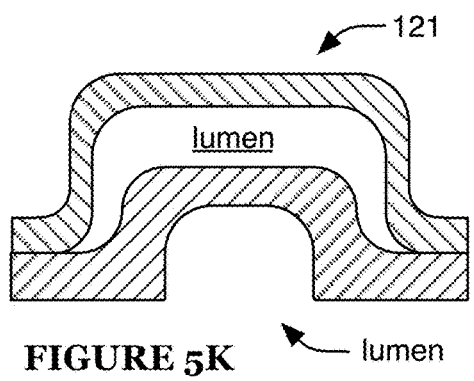
Figure 5L:
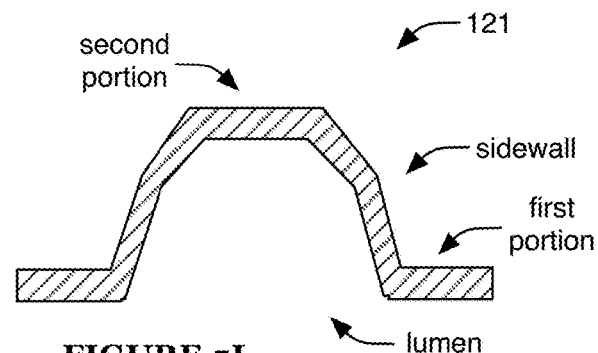
Figure 5O:
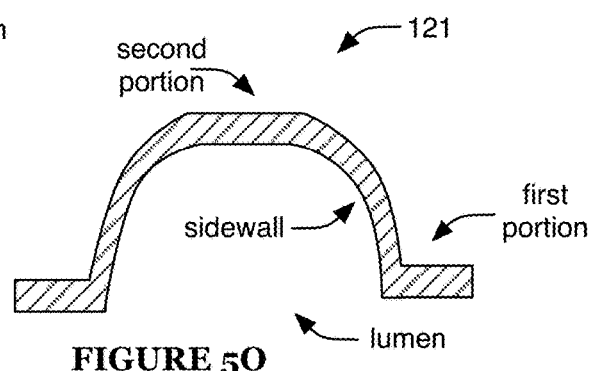
Figure 5M:
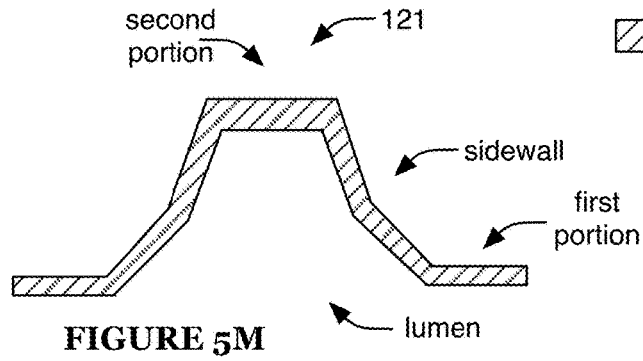
Figure 5P:
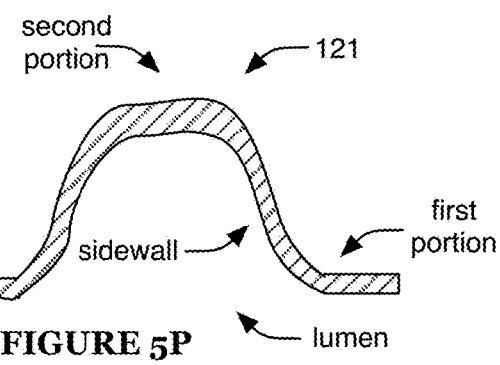
Figure 5N:
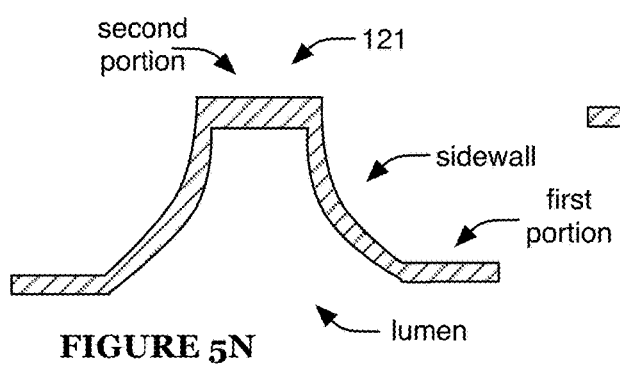
Figure 5Q:
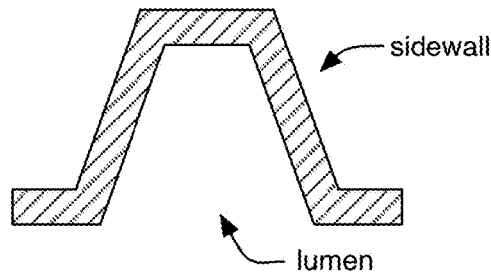
Figure 5R:
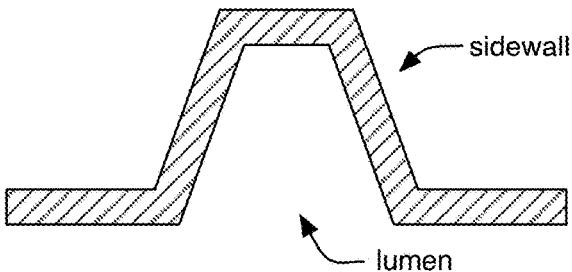
Figure 5S:
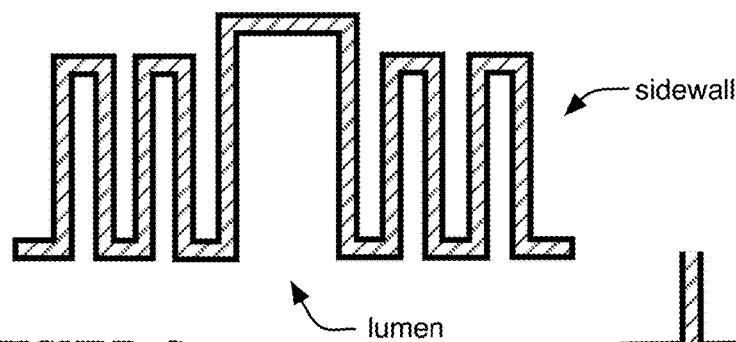
Figure 5U:
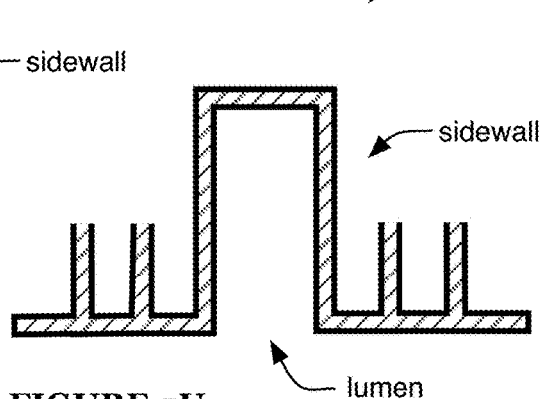
Figure 5T:
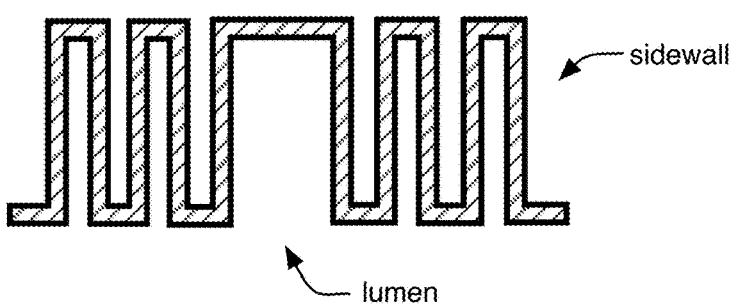
Figure 5V:
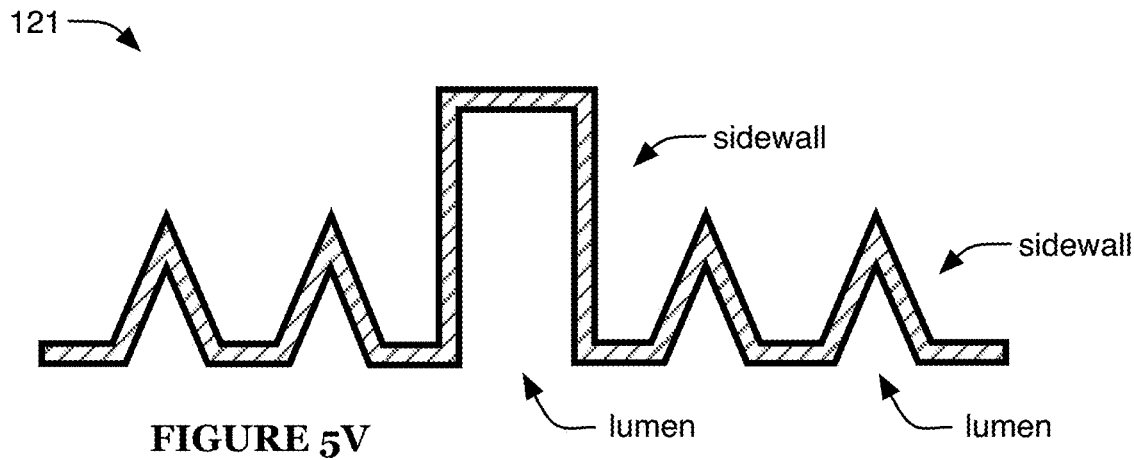
Figure 5W:
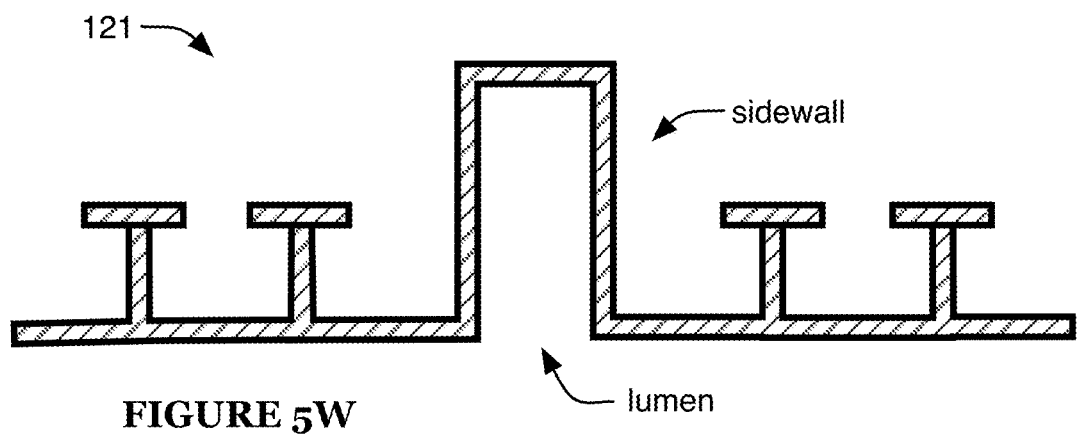
Figure 5X:
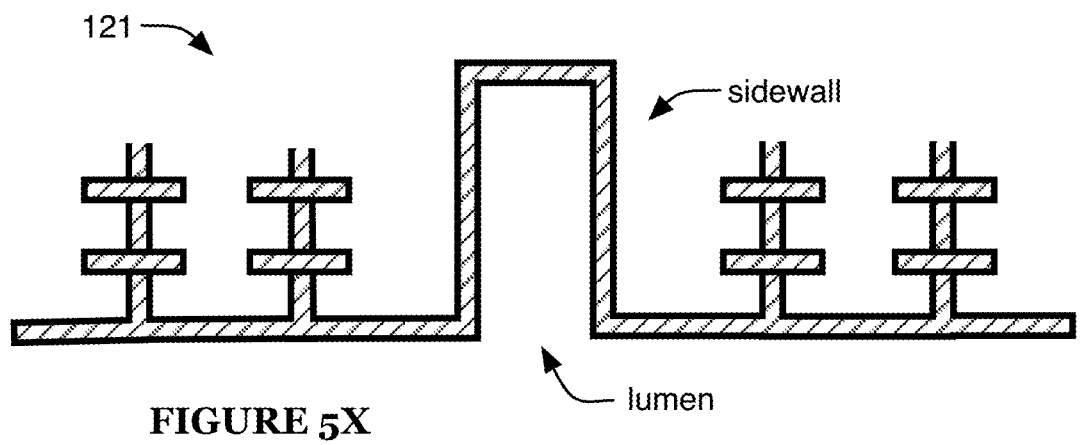

The leg cross-section(s) (e.g., in a plane perpendicular the inner electrode surface, such as a plane normal the path defined by the leg) can have any suitable shape. In a first embodiment, the cross-section is substantially rectangular (e.g., as shown in FIGS. 1B and 5E), and/or otherwise defines two substantially flat surfaces opposing each other across the leg (e.g., with no or substantially no lumen between these surfaces). In a second embodiment, the cross-section defines one or more lumens (e.g., as shown in FIGS. 5A-5D and 5F-5X). For example, the cross-section can define one or more vertical features (e.g., features configured to contact the electrode inner surfaces at each end, such as vertical walls spanning the spacer height), troughs (e.g., troughs of: C- or U-sections; H- or I-sections; corrugated, serpentine, wavy, crenate, and/or crenulate sections; etc.), holes (e.g., holes in tubes, such as rectangular and/or round tubes; rectangular and/or round holes; etc.), flanges (e.g., extending outward from a vertical spacer feature, such as extending along an electrode surface), and/or any other suitable features. In some examples in which the cross-section includes a crenate and/or crenulate portion (e.g., defines a bellows-like shape), it includes a single most-prominent feature that extends beyond (e.g., above) the other features (e.g., as shown in FIG. 5S), whereas in other such examples, multiple features (e.g., all crenate or crenulate features, such as merlons) extend substantially to a greatest prominence (e.g., as shown in FIG. 5T). In some examples, some or all portions of the cross-section can exhibit undulations (e.g., scalloping), such as arising from a DRIE process or other etch process under varying (e.g., periodic) conditions. In some examples, such features (e.g., crenate features, crenulate features, undulating features, etc.) can function to increase the surface path length between the electrodes along the spacer surface, thereby reducing parasitic conductance (e.g., electrical conductance) that may arise due to species (e.g., Cs, Ba, Sr, carbon monoxide, carbon dioxide, hydrogen, oxygen, argon, water, and/or compounds and/or reaction products thereof, such as Cs—H, Cs—OH, BaO, etc.) coating the spacer surfaces; however, the features can additionally or alternatively serve any other suitable purposes. The cross-section can define one or more leg (and/or leg feature) heights and/or widths, wall thicknesses, and/or any other suitable metrics.

The cross-section preferably defines a substantially uniform wall thickness (e.g., arising from deposition by a substantially conformal technique, such as atomic layer deposition, physical vapor deposition, chemical vapor deposition, etc.), but can alternatively define any suitable wall thicknesses (e.g., disparate wall thicknesses, gradually varying wall thicknesses, etc.). The wall thickness can be 10-1000 nm (e.g., 10-30 nm, 25-75 nm, 75-250 nm, 250-450 nm, 300-500 nm, 350-550 nm, 500-1000 nm, less than 100 nm, etc.), greater than 1000 nm, less than 10 nm, and/or any other suitable thickness.

The spacer 120 preferably includes a plurality of contact features 124 (e.g., specifically engineered into the spacer) at which the spacer is configured to contact the inner surface of an electrode. These contact features can include protrusions in the spacer (e.g., deviating from an otherwise substantially-consistent spacer cross-section), which extend toward the inner surface of one (or both) of the electrodes (e.g., as shown in FIGS. 7A-7C). The protrusions preferably extend along a direction (or directions) substantially normal to a broad face of the spacer (e.g., when the spacer is assembled between the electrodes, substantially normal to the inner surfaces of the electrodes), but can additionally or alternatively extend in any other suitable direction(s). In some embodiments, all (or substantially all) such contact features (e.g., protrusions) extend toward the same electrode, whereas in other embodiments, the contact features include a first subset extending toward the first electrode and a second subset extending toward the second electrode (away from the first electrode), preferably wherein the first and second subsets are disjoint (and more preferably, wherein they partition the set of all contact features).

In some embodiments, the contact features are defined such that a protrusion from one side of the spacer, such as a side facing the first electrode inner surface, opposes a complementary depression in an opposing side of the spacer, such as a side facing the second electrode inner surface). The contact features can include protrusions defining shapes (e.g., projections onto a plane, such as defined by the inner surface of an electrode; contact regions that make or substantially make contact with an electrode inner surface; etc.) such as filled regions (e.g., square, rectangular, circular, regions bounded in part by edges of the legs, elongated regions such as regions running substantially along and/or across one or more legs, etc.), perimeters (e.g., closed loop surrounding a non-protruding region), and/or any other suitable regions. For example, the spacer 120 includes protrusions (and complementary depressions) templated from topographical features patterned into the fabrication template, such as protruding and/or recessed points, lines, mesas, ridges, and/or any other suitable topographical features.

The contact features can include protrusions with sizes (e.g., length, width, diameter, height, etc.) substantially greater than (e.g., by at least a threshold factor, such as 1.1, 1.5, 2, 2.5, 3, etc.), similar to (e.g., within the threshold factor), and/or substantially less than (e.g., by at least the threshold factor) one or more characteristic sizes (e.g., width, height, wall thickness, length, etc.) of the legs of the spacer. The protrusions can extend outward by a height similar in magnitude to the spacer thickness (e.g., between 0.25 and 0.5 times the thickness, between 0.5 and 1 times the thickness, substantially equal to the thickness, between 1 and 2 times the thickness, between 2 and 3 times the thickness, etc.), but can alternatively be substantially less than the thickness, substantially greater than the thickness, and/or have any other suitable height. A characteristic in-plane dimension (e.g., width, diameter, length, etc.) of the protrusions can be similar in magnitude to the vertex width (e.g., between 0.25 and 0.5 times the vertex width, between 0.5 and 1 times the vertex width, substantially equal to the vertex width, between 1 and 2 times the vertex width, etc.), substantially less than the vertex width, substantially greater than the vertex width, and/or have any other suitable in-plane dimension (e.g., wherein the vertex width is preferably similar to the leg width, such as within 10, 20, 30, and/or 50% of the leg width, but can alternatively be substantially greater than or substantially less than the leg width). The characteristic in-plane dimension of the protrusions can be similar in magnitude to, substantially greater than, or substantially less than the leg width and/or the width of features of the leg, such as cross-sectional features (e.g., U-trough), and is preferably substantially less than the leg length (between vertices). For example, a spacer can include legs approximately 10-20 microns wide and approximately 0.4 mm (e.g., 0.1-1 mm) long, with a continuous cross-section feature (e.g., U-trough) approximately 4 microns (e.g., 1-10 microns) wide, and the protrusions can define an in-plane dimension (e.g., diameter) of approximately 40 microns (e.g., 10-100 microns).

In some examples, a protrusion can be defined over an area that does not entirely overlap a most-protruding feature of the spacer's typical (e.g., in the absence of the contact feature protrusion) cross-section; in such examples, the contact region is preferably defined by the intersection of the protrusion area and the area of that most-protruding feature, as this is the region that will protrude the farthest toward the electrode inner surface proximal to it. In a first specific example, in which the spacer's typical cross-section includes a most-prominent protrusion that extends farther than any other protrusions (e.g., as depicted in FIGURE SS), the protrusion can be defined over an area wider than the spacer leg (e.g., distance between the outer sidewalls of the cross-section). In other examples, such as examples in which the cross-section is substantially flat on the side from which the contact feature protrudes and/or any other suitable examples, the protrusions are defined entirely within the most-protruding feature described above, and so the contact region is preferably defined by the protrusion area. In a second specific example, in which the spacer's typical cross-section includes multiple protrusions of substantially equal prominence (e.g., as depicted in FIGURE ST), the protrusion can be defined over an area that does not extend to any protrusions other than one (e.g., the central protrusion), such as being limited to an area within the central protrusion, or extending into but not past one or both depressions bounding the central protrusion. In either case, the contact regions (of all protrusions of the first or second subset) can represent a fractional portion of the total active area (e.g., electrode surface area). This fractional portion is preferably less than 2%, more preferably less than 1% and greater than 0.05%, such as 0.05-0.1, 0.1-0.2, 0.2-0.3, 0.3-0.5, 0.5-0.75, or 0.75-1%, but can alternatively be less than 0.05%, greater than 2% (e.g., 2-5%), and/or have any other suitable value.

The contact features 124 are preferably located at (and/or near) vertices 122 of the spacer (e.g., all vertices 122 or a subset thereof). However, the contact features can additionally or alternatively be located along the legs 121 (e.g., between the vertices 122, such as approximately half-way between neighboring vertices and/or at any other suitable location along the length of the legs) and/or in any other suitable regions of the spacer.

The number and/or density of contact features 124 of the spacer is preferably defined relative to the (number and/or density of) vertices and/or legs. In examples, the spacer can include an equal (or substantially equal) number of contact features and vertices and/or legs (e.g., one contact feature located on each vertex or leg), fewer contact features than vertices and/or legs (e.g., one contact feature for every 2, 3, 4, 5, 6-10, more than 10, or non-integer number of vertices or legs), more contact features than vertices and/or legs (e.g., 2, 3, 4, 5, 6-10, more than 10, or non-integer number of contact features for every vertex or leg, such as wherein the same number of contact features are located on each vertex or leg), and/or any other suitable number of contact features in any suitable arrangement. The contact features preferably define a regular (or substantially regular) array, more preferably wherein the periodicity of the contact features matches (or substantially matches) the periodicity of the vertices (and/or legs), such that the vertices (and/or legs) and contact features together also define a regular (or substantially regular) array, but can alternatively have any other suitable arrangement.

In embodiments including two subsets of contact features (e.g., as described above, wherein one subset extends toward one electrode and the other subset extends toward the other electrode), the number, density, and/or arrangement of contact features of each subset can be defined analogously. In such embodiments, the number of contact features of the two subsets can be the same (e.g., each subset including 1 contact feature for every 2 vertices or for every 2 legs) or different (e.g., wherein the first subset includes 1 contact feature for every 2 vertices or for every 2 legs, and the second subset includes 3 contact features for every 2 vertices or for every 2 legs). The spacer preferably includes sufficient contact features (in appropriate locations on the spacer) to maintain the desired separation between the electrodes (e.g., maintain substantially at the desired spacing, maintain with minimal thermal contact between the electrodes, maintain without significant mechanical deformation of the spacer, etc.), such as sufficient to resist forces in the system (e.g., pressure, such as arising from a pressure differential between atmospheric pressure and full or partial vacuum; vibration; etc.). However, the spacer preferably includes few enough contact features (and/or contact features of sufficiently small contact area, having appropriate arrangement on the spacer, etc.) to maintain the desired thermal isolation between the electrodes. Accordingly, the number (and/or other aspects) of contact features is preferably optimized based on these (and/or other) criteria.

In one example, the spacer includes contact features (e.g., all extending toward, and preferably contacting, the same electrode) at and/or near 50% of its vertices (or contact features of a single subset, all extending toward, and preferably contacting, the same electrode), preferably wherein the contact features are substantially evenly spaced (e.g., for every vertex with a contact feature, none of the nearest neighbor vertices has a contact feature, and for every vertex without a contact feature, all of the nearest neighbor vertices has a contact feature). In a variation of this example, the spacer includes a first subset of contact features, extending toward the first electrode, such as described above, and also includes a second subset of contact features, extending toward the second electrode, also located at and/or near 50% of the vertices and having substantially even spacing. In a first specific example of this variation, the contact features of the second subset are located at and/or near the same vertices as the contact features of the first subset. In a second specific example of this variation, the contact features of the second subset are located at the vertices at which the contact features of the first subset are not located. However, the contact features can additionally or alternatively be arranged in any other suitable manner with respect to each other and/or the other elements of the spacer.

In some embodiments, the contact features can be arranged such that spacer contact points with the first electrode inner surface are significantly offset (e.g., in a lateral direction, such as a direction substantially parallel an electrode inner surface) from spacer contact points with the second electrode inner surface, such as offset by more than a threshold distance (e.g., 10 nm, 50 nm, 100 nm, 500 nm, 1000 nm, 5000 nm, 0.01 mm, 0.05 mm, 0.1 mm, 0.2 mm, 0.3 mm, 0.4 mm, 0.5 mm, 0.75 mm, 1 mm, 2 mm, 5 mm, 10-100 nm, 100-1000 nm, 1-10 µm, 10-100 µm, 0.1-1 mm, 1-10 mm, etc.). This can, for example, increase the effective path length for thermal transport through the spacer (e.g., from a contact point with the first electrode inner surface, laterally through the spacer, to a contact point with the second electrode inner surface), thereby increasing the inter-electrode thermal isolation. For example, the contact features of the first and second subsets can be located in different locations along the spacer, such as at and/or near different vertices (e.g., as described above, wherein the contact features are separated laterally by the length of a spacer leg; as shown by way of example in FIG. 7C; etc.).

Additionally or alternatively, some or all contact features from the different subsets can be located near each other (e.g., at and/or near the same vertices). In some such examples, the contact features can be slightly offset from each other laterally. In a first example, one or more contact features of the second subset are arranged around one or more contact features of the first subset (e.g., wherein the contact feature(s) of the first subset is substantially centered at a vertex, and the contact feature(s) of the second subset are arranged around it on the vertex and/or the leg extending from the vertex). In specific examples, this can include a single second subset contact feature (or multiple such features, such as arranged substantially concentrically) defining a perimeter around the first subset contact feature(s), or a plurality of second subset contact features arranged around the first subset contact feature(s) (e.g., as shown in FIG. 7B). In a second example, contact features of the different subsets can be arranged side-by-side (e.g., in a symmetrical or asymmetrical arrangement). However, the contact features can additionally or alternatively have any other suitable arrangement.

In some embodiments, contact features of the first subset may have different characteristics (e.g., protrusion height, feature width, numerosity and/or feature density, etc.) than contact features of the second subset. For example, the protrusions of the first subset may define a greater protrusion height than the protrusions of the second subset, such as wherein the first subset protrude by 400 nm and the second subset protrude (in the opposite direction of the first subset) by 600 nm. This could be advantageous, for example, if the thermal conductivity of the spacer material differs significantly based on temperature (e.g., for the temperature of the first electrode inner surface versus the second electrode inner surface), as a longer protrusion could be employed on the side that exhibits higher thermal conductivity. Additionally or alternatively, a shorter protrusion may be employed on the hot side of the spacer (e.g., the side that contacts the cathode), which can function to ensure a higher spacer temperature, thereby reducing undesired residence of species (e.g., low work function coating species, such as Cs) on the surfaces of the spacers (e.g., thereby reducing parasitic electrical conductivity arising from such species); analogously, in embodiments including only contact features protruding in a single direction, the contact features preferably protrude from the cold side of the spacer (e.g., contacting the anode), so that greater thermal contact is achieved between the spacer and cathode than between the spacer and anode, leading to an increased spacer temperature. Additionally or alternatively, contact features of the two subsets may exhibit different mechanical robustness from each other (e.g., due to placement on different portions of the spacer, such as placement on a flange versus on a trough). However, the contact features of the two subsets can additionally or alternatively exhibit any other suitable characteristics.

In some embodiments, some or all of the spacer can exhibit surface roughness (e.g., random or pseudo-random roughness, such as roughness templated from the surface roughness of a fabrication substrate, typically achieved via an etching process such as xenon difluoride etching, and/or roughness achieved by roughening the fabricated spacers, such as achieved by an annealing treatment; in one example, the fabricated spacers are roughened via an annealing treatment such as described in Broas, Mikael, et al. "Chemically stable atomic-layer-deposited $Al_2O_3$ films for processability." ACS omega 2.7 (2017): 3390-3398., which is herein incorporated in its entirety by this reference), such as roughness greater and/or less than a threshold value (e.g., 0.1, 0.5, 1, 5, 10, 20, 30, 50, 75, 100, 125, 150, 200, 300, 0.1-1, 1-10, 10-25, 25-65, 65-100, 100-150, 150-200, and/or 200-400 nm rms roughness). This roughness can function to reduce the amount of spacer material that contacts one or both electrodes, and/or can have any other suitable function(s). Although described as roughness, this can additionally or alternatively include any other suitable surface texturing and/or patterning (e.g., regular, random, or pseudo-random arrangement of features such as pits, peaks, mesas, valleys, plateaus, troughs, etc.) that functions to reduce spacer contact with the electrode(s). The surface roughness can be present on one or both faces of the spacer. The surface roughness can be present on the contact features (e.g., all contact features, a subset thereof such as the first or second subset described above, etc.) and/or the non-contact feature portions of the spacer. Surface roughness can be present on substantially all of a contact feature, or only on a portion thereof (e.g., thereby reducing the portion of the contact feature that may directly contact the adjacent electrode inner surface). In some examples, the spacer can include a first subset of contact features, which protrude toward a first electrode, and a second subset of contact features defined by surface roughness (e.g., on a face of the spacer opposing the first electrode), such as wherein regions of the non-contact feature portions of the spacer (or all non-contact feature portions of the spacer) exhibit such surface roughness. However, the spacer can additionally or alternatively exhibit any other suitable surface characteristics.

The overall spacer height (preferably under compression, but alternatively free-standing) preferably functions to define the inter-electrode spacing (e.g., is substantially equal to the spacing). In some applications (e.g., thermionic energy converter applications), the inter-electrode spacing (e.g., inter-electrode gap width; preferably defined by the spacer height and/or leg height, etc.) is preferably 0.1-10 μm, more preferably 0.2-5 μm (e.g., 0.25 μm, 0.35 μm, 0.4 μm, 0.5 μm, 0.6 μm, 0.75 μm, 1 μm, 1.5 μm, 2 μm, 3 μm, 4 μm, 5 μm, etc.), more preferably 0.5-5 μm (e.g., 0.5-1.5, 1.5-3, or 2.5-5 μm, etc.), but can alternatively be 50-200 nm, less than 50 nm, 2-5 μm, 5-15 μm, 15-50 μm, greater than 50 μm, or any other suitable height; in other applications (e.g., thermophotovoltaic applications), the inter-electrode spacing is preferably less than 1 μm (e.g., less than 750, 500, 300, 200, 150, 100, 75, 50, and/or 25 nm), but can alternatively be greater than 1 μm or any other suitable height. The leg width and leg feature widths are preferably micron scale (e.g., 1-10 μm, 10-100 μm, etc.), but can additionally or alternatively be 100 nm-1 μm, less than 100 nm, greater than 100 μm, and/or be any other suitable widths.

In a first embodiment (e.g., in which the leg cross-section is substantially rectangular, except for the presence of contact features such as protrusions), the spacer height is equal (or substantially equal) to the wall thickness plus the height of the contact features (e.g., for contact features all extending toward a single electrode, the contact feature height; for contact features including a first subset extending toward a first electrode and a second subset extending toward a second electrode, the sum of the height of a contact feature of the first subset and one of the second subset). In a variation of this embodiment, in which the first and second subsets of contact features are laterally displaced, the spacer may exhibit deformation (e.g., due to compressive forces, such as from a pressure differential) between the locations of the contact features of the first and second subsets, thereby decreasing the spacer height under compression (e.g., relative to the free-standing spacer height). In a second embodiment (e.g., in which the leg cross-section defines one or more lumens), the spacer height is equal (or substantially equal) to the leg cross-section height plus the height of the contact features (analogous to the description above regarding contact feature height of the first embodiment). However, the spacer height can additionally or alternatively be defined based on any other suitable aspects of the spacer.

Figure 6A:
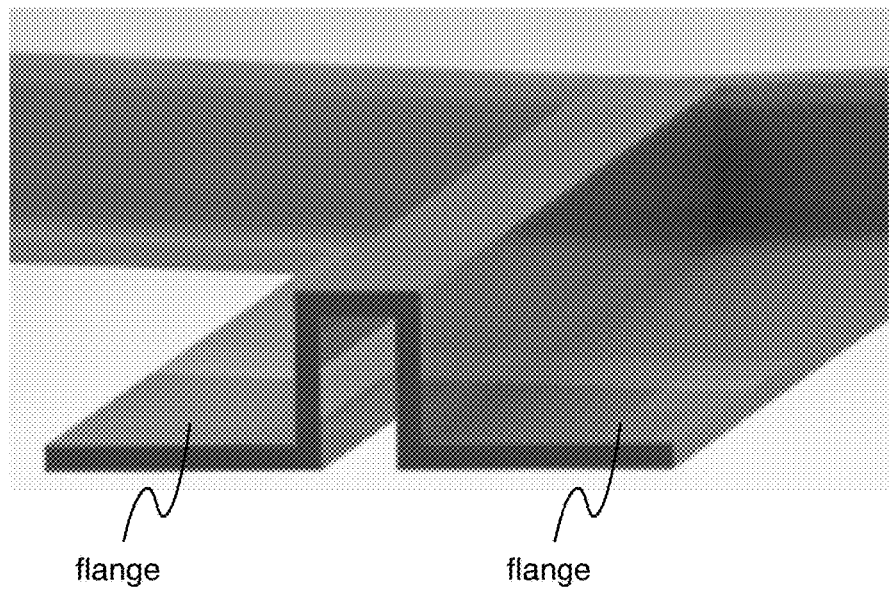
FIG. 6A is a cross-sectional perspective view of a specific example of the spacer.
Figure 6B:
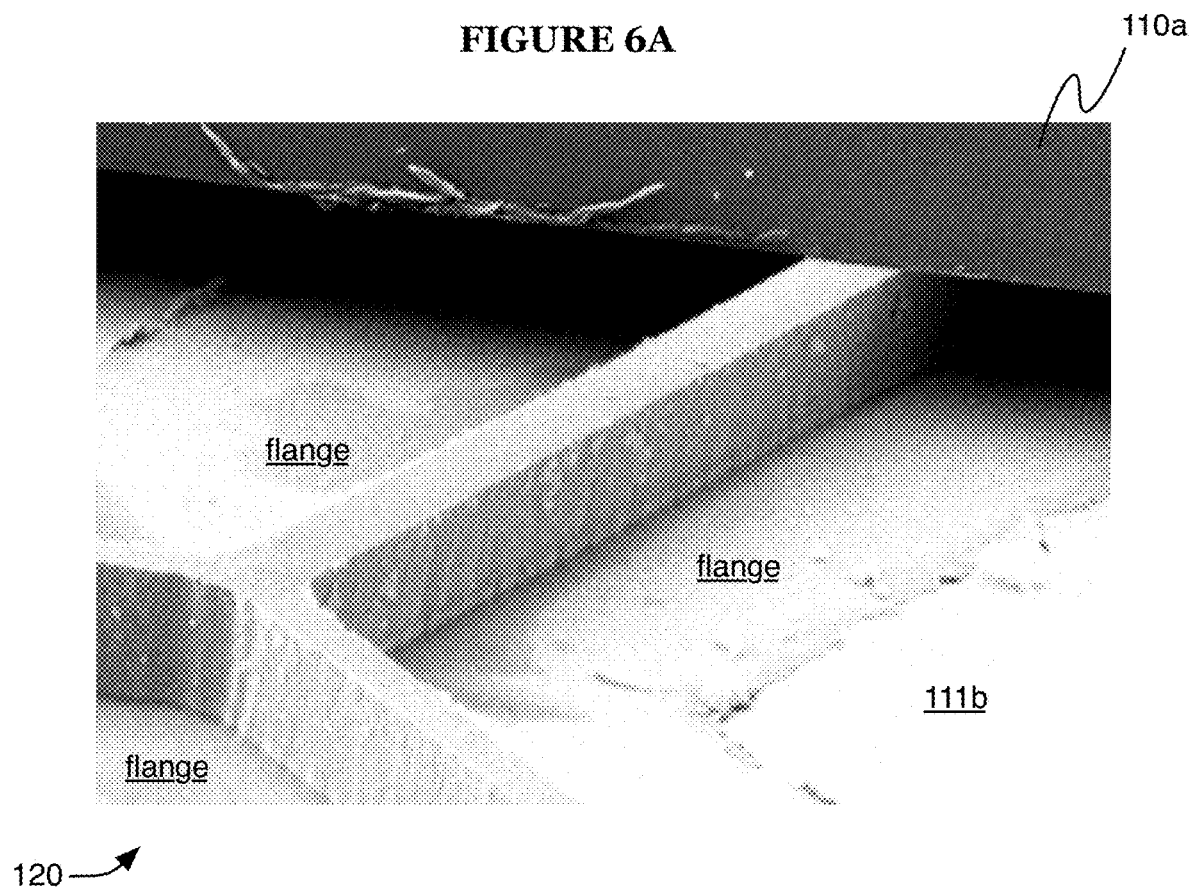
FIG. 6B is a perspective view of a specific example of the spacer arranged between two electrodes.

The spacer aspects (e.g., legs, contact features, etc.) can define any suitable dimensions. In a first example, the legs 121 define a substantially consistent cross-section (except for at the contact features), which substantially defines a rectangle of substantially uniform thickness. In a specific example of this embodiment, the rectangle thickness (wall thickness) is 400 nm, the leg width is less than 5 μm (e.g., 4 μm), the contact features define a lateral dimension of 10-50 μm (e.g., 40 μm), and the contact features protrude toward the electrode(s) by less than twice the layer thickness (e.g., by 500 nm). In a second example, the legs 121 define a substantially consistent cross-section (except for at the contact features), which defines a substantially uniform wall thickness, includes a single U-section rib, and optionally includes a flange on one or both sides of the rib (e.g., as shown in FIG. 6A-6B). In a specific example of this embodiment, the wall thickness is 100 nm, the leg height (defined by the rib) is 750 nm, the rib width is 1.5 μm, the flanges are less than 5 μm wide, the contact features define a lateral dimension of 10-50 μm (e.g., 40 μm), and the contact features protrude toward the electrode(s) by less than twice the wall thickness (e.g., by 150 nm).

The spacers 120 preferably include (e.g., are made of) one or more thermally and/or electrically insulating materials. The materials can include oxide compounds (e.g., metal and/or semiconductor oxides) and/or any other suitable compounds, such as metal and/or semiconductor nitrides, oxynitrides, fluorides, and/or borides. For example, the materials can include oxides of Al, Be, Hf, La, Mg, Th, Zr, W, and/or Si, and/or variants thereof (e.g., yttria-stabilized zirconia). The spacer materials are preferably substantially amorphous, but can additionally or alternatively have any suitable crystallinity (e.g., semi-crystalline, nano- and/or micro-crystalline, single-crystalline, etc.), which can include materials with grains of substantially uniform size, random grain sizes, and/or otherwise varying grain sizes. In some examples, the spacer materials exhibit nanolaminate order and/or other nanoscale order. The crystallinity, order, and/or other aspects of the spacer material can be substantially uniform throughout the spacer, can vary across the spacer thickness (e.g., differ between the side that contacts the first electrode and the side that contacts the second electrode, such as differing in the effect they have on thermal properties of the spacer and/or spacer material), and/or can vary in any other suitable manner. The spacer materials preferably exhibit compatibility (e.g., do not react, or at least react in a manner that negatively affects spacer and/or system performance, with other materials of and/or species present in the system, such as cesium, titania, tungsten, molybdenum, niobium, and/or any other suitable materials and species), such as high-temperature compatibility (e.g., at or above the typical operating temperatures of the system). In some examples, materials and/or species with which the spacer materials exhibit compatibility can include one or more of: cesium (and/or cesium compounds, such as cesium hydroxide, cesium oxides, etc.), titania, tungsten, molybdenum, niobium, nickel, nickel-based superalloys, copper, semiconductor materials (e.g., silicon, GaAs, etc.), solders and/or braze materials, nitrogen, oxygen, argon, hydrogen, carbon oxides (e.g., CO, $CO_2$, etc.), water, and/or reaction products of any elements of this list. The spacer materials preferably have a lower hardness than the electrode inner surfaces that they contact (e.g., to reduce abrasion of the electrode inner surfaces by the spacer), but can alternatively be harder than the electrode inner surfaces (e.g., wherein the electrode inner surfaces deform around the spacer) or have any other suitable hardness. In some examples, the spacers can include one or more materials (e.g., alumina and/or zirconia materials) and/or any other suitable aspects such as described in Bellucci, Alessandro, et al., "Dielectric Micro- and Sub-Micrometric Spacers for High-Temperature Energy Converters", *Energy Technology* (2020): 2000788, which is herein incorporated in its entirety by this reference. However, the spacers 120 can additionally or alternatively include any other suitable materials (e.g., as described above regarding materials).

The spacers 120 preferably include a combination of two or more materials (e.g., enabling material property tuning, protection of less robust materials, etc.), but can alternatively include a single material. The material combinations can include alloys, mixtures (e.g. isotropic mixtures, anisotropic mixtures, etc.), nanolaminates, multilayer stacks (e.g., of oxides, alloys, mixtures, nanolaminates, etc.), and/or any other suitable combinations. For example, multilayer stacks can reduce thermal and/or electrical conductions (e.g., due to carrier boundary scattering), and/or can increase spacer robustness (e.g., at high temperature, in chemically-reactive environments, etc.), such as by partially or entirely encapsulating less robust materials within more robust material layers.

In a first example, the spacers 120 are made of a hafnia aluminate alloy (e.g., formed by alternating deposition via ALD of one or more layers of alumina followed by one or more layers of hafnia). In specific example, the alloy includes 2, 3, 4, 5, or 6 monolayers of alumina for every monolayer of hafnia (or includes any other suitable hafnia-alumina ratio).

In a second example, the spacers are made of a nanolaminate, such as including alternating layers of different oxides, such as alternating between layers of zirconia and a hafnia aluminate alloy (e.g., alloy such as described above regarding the first example, such as an alloy including three monolayers of alumina for every monolayer of hafnia). The nanolaminate preferably includes substantially equal layer thicknesses of the hafnia aluminate alloy layers and the zirconia layers, but can alternatively include different layer thicknesses for the alloy layers versus the zirconia layers. For example, the nanolaminate can be formed by alternating deposition (e.g., via ALD) of the hafnia aluminate alloy and zirconia. In specific examples, each repeat unit of the nanolaminate can include: 5 hafnia aluminate alloy layers (e.g., each alloy layer including 3 monolayers of alumina and 1 monolayer of hafnia) and 20 zirconia monolayers; 1 alloy layer and 4 zirconia monolayers; 8 alloy layers and 32 zirconia monolayers; or 16 alloy layers and 64 zirconia monolayers (but can alternatively include any other suitable repeat units). In variations, the zirconia of this example could be replaced by another compound (e.g., another oxide, such as magnesia, beryllia, thoria, lanthana, etc.).

In a third example, the spacers 120 include a multilayer (e.g., three-layer, etc.) structure, with an intermediary layer (e.g., including alumina or an alumina-containing compound, such as a hafnia-alumina alloy; including hafnia or a hafnia-containing compound, such as a hafnia-alumina alloy; preferably consisting essentially of this material, but additionally or alternatively including other materials, such as one or more nanolaminates described above regarding the second example) in between (e.g., substantially encapsulated between) two outer layers (e.g., including hafnia or a hafnia-containing compound, such as a different hafnia-alumina alloy than the intermediate layer; including alumina or an alumina-containing compound, such as a different hafnia-alumina alloy than the intermediate layer; preferably consisting essentially of this material), the two outer layers having the same or different materials as each other, which can function, for example, to reduce evaporation and/or crystallization of species in the intermediary layer (e.g., Al, Hf, etc.) at high temperatures (additionally or alternatively, the material can incorporate a small portion of additives, such as particles and/or localized inclusions, which can function to reduce crystallization). In this third example, the first outer layer preferably contacts the first electrode inner surface, and the second outer layer preferably contacts the second electrode inner surface.

Material combinations and/or surface functionalizations (e.g., including terminations such as hydrogen, hydroxyl, hydrocarbon, nitrogen, thiol, silane, etc.) can additionally or alternatively be employed to alter (e.g., enhance, reduce) surface adhesion (e.g., to an electrode inner surface), thermal and/or electrical contact, diffusion (e.g., interdiffusion), chemical reactions, and/or any other suitable interfacial properties and/or processes. For example, the spacer 120 can include a first layer arranged in contact with a first electrode (e.g., cathode, anode) inner surface and a second layer arranged in contact with a second electrode (e.g., opposing the first electrode) inner surface. In a first example, the first layer exhibits strong adhesion to the first electrode inner surface (e.g., the first layer-first electrode interface has low interfacial energy), and the second layer exhibits weak adhesion to the second electrode inner surface (e.g., the second layer-second electrode interface has high interfacial energy); in this example, the first electrode is preferably the cathode (e.g., thereby resulting in an elevated spacer temperature, which can reduce surface residence of species such as Cs, Ba, Sr, carbon monoxide, carbon dioxide, hydrogen, oxygen, argon, water, and/or compounds and/or reaction products thereof, such as Cs—H, Cs—OH, BaO, etc.) but can alternately be the anode. In a second example, both the first and second layers exhibit weak adhesion to the respective inner surface that they contact (e.g., have high interfacial energy and/or substantially equal interfacial energy). In a third example, both the first and second layers exhibit strong adhesion to the respective inner surface that they contact (e.g., have low interfacial energy and/or substantially equal interfacial energy). In a specific example, a spacer surface contacting the cathode includes a H-terminated surface functionalization, and a spacer surface contacting the anode includes a OH-terminated surface functionalization.

Additionally or alternatively, materials (e.g., material combinations), surface coatings, and/or other surface functionalizations can be employed to alter (e.g., reduce) surface adhesion of species such present in the gap (e.g., Cs, Ba, Sr, carbon monoxide, carbon dioxide, hydrogen, oxygen, argon, water, and/or compounds and/or reaction products thereof, such as Cs—H, Cs—OH, BaO, etc.) and/or to reduce the parasitic conduction (e.g., electrical conduction, such as surface conduction) arising from such adhered species. In a first example, the spacer can be coated with a low-k dielectric material (e.g., a few-nanometer thick coating, such as 1-10 nm or 2-4 nm, etc.); such material is preferably substantially non-porous but can alternatively be porous. In a second example, the spacer can be engineered to exhibit a low work function (e.g., in the absence of a species such as Cs), such as including a coating of one or more materials such as lanthanum and/or lanthanum compounds, titanium oxide, tantalum oxides, metallic and/or semiconducting materials, and/or any other suitable materials, which may function to reduce the extent to which cesium adheres to the spacer; additionally or alternatively, the spacer can be coated (e.g., wet) by a species such as barium, which may function to reduce the extent to which cesium will adhere to the spacer.

Additionally or alternatively, the spacer (and/or portions thereof) can be otherwise engineered to reduce electrical surface conduction (e.g., parasitic conduction arising from adhesion of species present in the gap, such as described above). For example, one or more portions of the spacer can include (e.g., be made of, be coated with, etc.) one or more conductive, semiconducting, semi-insulating, and/or low work function materials, wherein the higher density of states present in these portions can function to reduce adsorption of species (e.g., Cs, Ba, Sr, and/or compounds and/or reaction products thereof, etc.) and/or repel the expansion of the electron clouds of such species, thereby reducing the associated parasitic surface conduction. In some examples, such portions can be arranged such that they define a break for surface conduction between the electrodes (e.g., wherein any surface path between the electrodes will traverse one or more such portions), but without creating a bulk conductive path between the electrodes (e.g., wherein a majority of the length of bulk paths between the electrodes will traverse the less-conductive portions of the spacer). For example, the more-conductive portions (e.g., a few nm in length, such as 1-5 nm, 2-3 nm, etc.) can be arranged at or near contact points with one or both electrodes, along spacer sidewalls, and/or in any other suitable locations.

However, the spacers 120 can include any other suitable combination of materials, coatings, and/or functionalizations.

The spacers 120 can optionally include one or more frames and/or handling features. For example, a spacer, preferably defining a size substantially corresponding to an electrode (e.g., having substantially identical shapes and/or sizes), can include a frame (e.g., that extends outside the active region of the system, such as the area of the electrode when the spacer 120 is aligned and in contact with the electrode), which can enable facile handling of the spacer 120 (e.g., during assembly of the small-gap device). The frame is preferably a robust feature (e.g., more mechanically robust than the interior portion of the spacer). In a first example, the frame includes a substantially non-planar leg (e.g., including one or more U-troughs along the length of the legs), whereas the legs within the active region define a substantially planar cross-section (e.g., except for any contact features); in this example, the frame is preferably fabricated in the same manner (e.g., in the same process) as the rest of the spacer (e.g., conformally deposited onto a lithographically-defined template). In a second example, the frame includes a continuous and/or thick structure (e.g., rather than a thin structure interrupted by apertures); in this example, the frame preferably includes materials (e.g., nylon) other than those of the spacer active region, and can be fabricated separately from fabrication (e.g., deposition) of the spacer active region. However, the increased rigidity of the frame can additionally or alternatively be achieved in any other suitable manner. In some examples, the frame is configured to break away from the spacer 120 (e.g., after device assembly), for example, from mechanical separation and/or thermal expansion stresses (e.g., the frame is connected to the interior portion of the spacer at intentionally-weakened interfaces, such as interfaces including perforations).

In some embodiments, the spacer(s) (and/or other elements of the system) can include one or more structures such as those described in U.S. patent application Ser. No. 15/456,718, which is hereby incorporated in its entirety by this reference, and/or include elements of such structures (e.g., modified such as described herein, such as defining non-linear paths and/or non-linear spacer surfaces, including multiple materials such as multilayer stacks, etc.).

The spacer(s) can additionally or alternatively include any other suitable features in any suitable arrangement.

The spacer 120 is preferably arranged between the electrodes (e.g., between the inner surfaces of the electrodes). A lateral plane of the spacer and the inner surfaces of each electrode are preferably substantially parallel, but can alternatively have any other suitable arrangement.

In some examples, the system can additionally or alternatively include (e.g., within the gap between the electrodes, exposed to the species contained within the gap between the electrodes such as arranged elsewhere within the same enclosure as the species within the gap and/or fluidly coupled or coupleable to the species within the gap, etc.) one or more getters, which can function to reduce the presence of one or more species (e.g., species which may be deleterious to operation and/or longevity of the system, such as oxygen, nitrogen, hydrogen, carbon oxides, methane, etc.) in the gap. Such getters can include flash getters, in which a material (e.g., Ba, U, Th, W, etc.) is evaporated to activate the getter; coating getters, in which a coating (e.g., sintered powder) of one or more reactive materials coats one or more surfaces of the system; bulk getters, which may exhibit a passivation layer present at reduced temperatures (e.g., room temperature) that is partially or entirely removed by heating, thereby enabling the bulk material (e.g., Ti, Zr, U, Th, Ce, La, Al, and/or compounds thereof, such as titanium-zirconium alloys, cerium-lanthanum mischmetals, etc.) to act as a getter (e.g., into which species, such as oxygen, can diffuse and be trapped); and/or any other suitable getters.

However, the system can additionally or alternatively include any other suitable elements in any suitable arrangement.

2. Method of Fabrication.

Figure 8A:
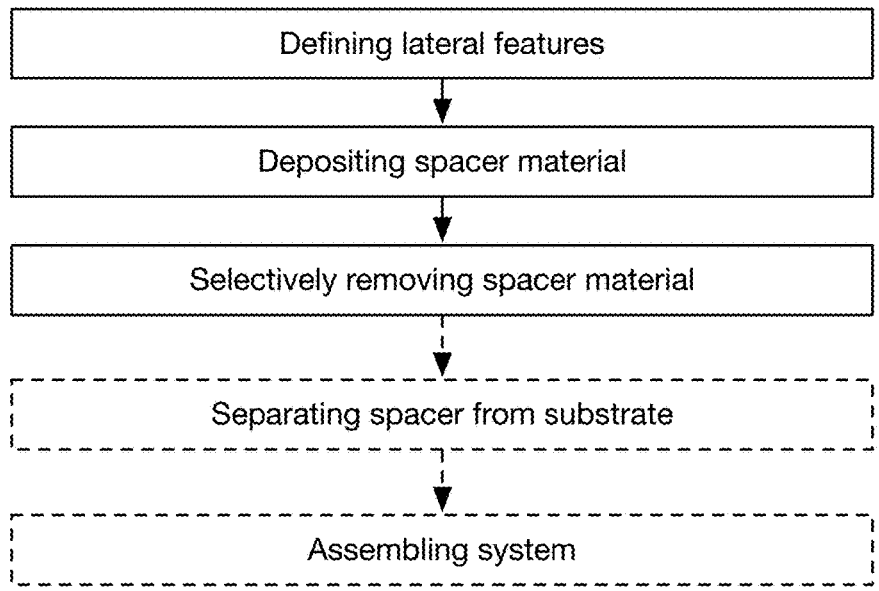
FIG. 8A is a flowchart representation of an embodiment of the method of fabrication.
Figure 8B:
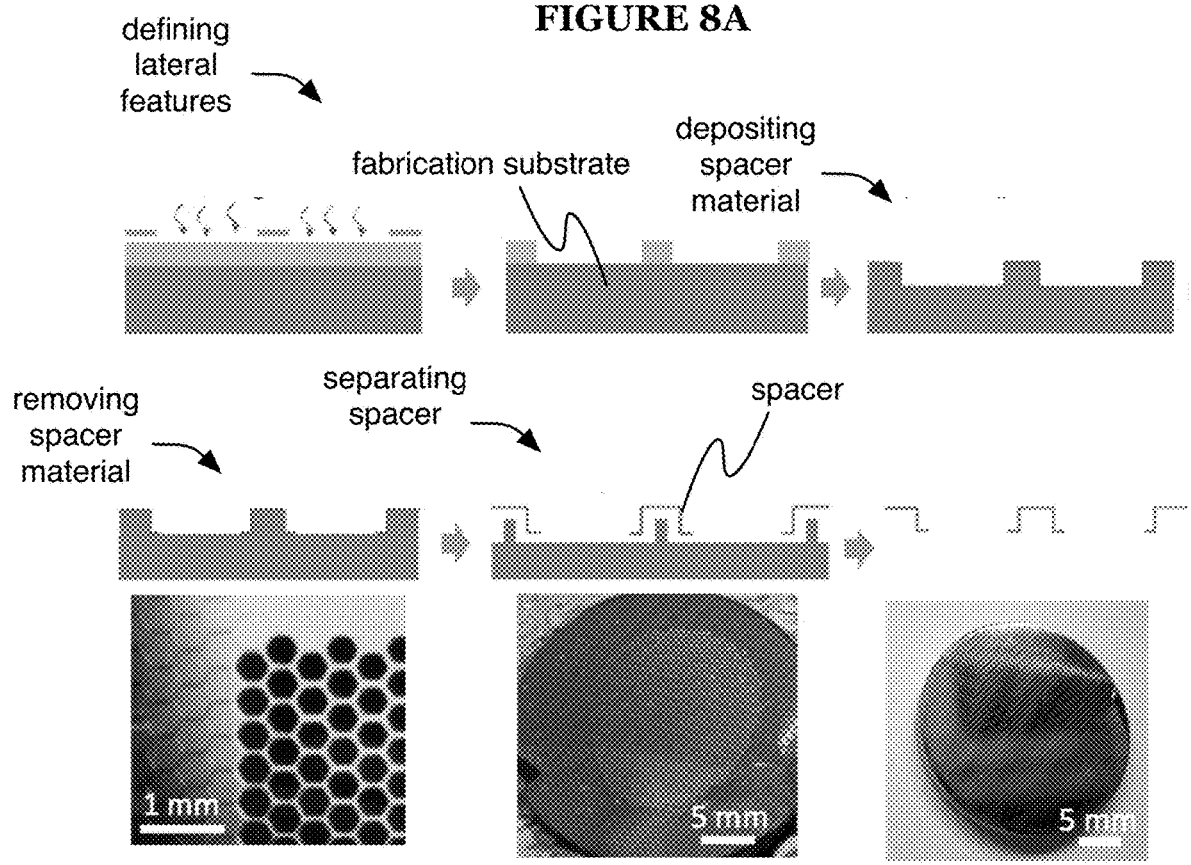
FIG. 8B is a schematic representation of an example of the method.

A method of fabrication preferably includes defining lateral features, depositing spacer material, selectively removing spacer material, and separating the spacer from the fabrication substrate (e.g., as shown in FIGS. 8A-8B). The method can optionally include assembling the system.

Defining lateral features preferably includes creating a pattern on a fabrication substrate (e.g., substrate having a smooth surface, such as a polished silicon wafer). The lateral features (e.g., paths, vertices, channel widths, etc.) are preferably defined by lithography (e.g., photolithography), which can enable definition of arbitrary lateral features. However, the lateral features can additionally or alternatively be defined using self-assembly techniques (e.g., followed by a joining process, such as sintering, to create a free-standing spacer) and/or any other suitable techniques.

Spacer material is preferably deposited onto the patterned fabrication substrate. The spacer material is preferably deposited using a substantially conformal deposition technique (e.g., atomic layer deposition, chemical vapor deposition, plating, some physical vapor deposition techniques, etc.), but can additionally or alternatively be deposited using a less conformal technique (e.g., some physical vapor deposition techniques) and/or in any other suitable manner. The deposition is preferably controlled to deposit the desired spacer wall thickness. For alloyed and/or multilayer spacers 120, the spacer materials can be deposited sequentially, deposited in an alternating manner (e.g., creating multiple distinct layers, multiple layers that can subsequently diffuse into an alloy, a single alloyed layer, etc.), co-deposited, and/or deposited in any other suitable manner.

In one example, to fabricate a spacer that includes a layer of hafnia between layers of alumina, depositing spacer material can include: depositing a first layer of alumina onto the patterned fabrication substrate, depositing a layer of hafnia onto the first layer of alumina, and depositing a second layer of alumina onto the layer of hafnia. Similarly, to fabricate a spacer that includes a layer of alumina between layers of hafnia, depositing spacer material can include: depositing a first layer of hafnia onto the patterned fabrication substrate, depositing a layer of alumina onto the first layer of hafnia, and depositing a second layer of hafnia onto the layer of alumina. Additionally or alternatively, incomplete layers of some or all species can be deposited, which can promote alloying, rather than layering, of the species.

In a second example, to fabricate a spacer that includes an interior (e.g., second) lumen, depositing spacer material can include: depositing a first layer (or set of layers, such as a multilayer stack as described above) of spacer material(s) onto the patterned fabrication substrate, depositing a sacrificial layer (e.g., of a material that can be etched away, preferably the same material and/or a material etchable by the same process as the fabrication substrate, such as Si) onto the first layer, and depositing a second layer (or set of layers, such as a multilayer stack as described above) of spacer material(s) onto the sacrificial layer. In a specific example of the second example, to fabricate a spacer that includes one or more support members (e.g., posts, columns, tubes, etc.) within the interior lumen, depositing spacer material can further include, before depositing the second layer of spacer material, patterning and etching the sacrificial layer to define the support members, wherein the support members are preferably deposited concurrently with the second layer, but can alternatively be deposited before the second layer and/or at any other suitable time.

In these examples, the layers are preferably deposited sequentially using atomic layer deposition, but some or all of the layers can additionally or alternatively be deposited using chemical vapor deposition, physical vapor deposition, and/or in any other suitable manner. However, depositing spacer material can be performed in any other suitable manner.

Selectively removing spacer material preferably includes removing undesired material (e.g., after spacer material deposition onto the fabrication substrate; preferably before but additionally or alternatively after spacer separation from the fabrication substrate). Undesired material can include spacer material between the intended paths (e.g., outside the patterned features; more than a threshold distance, such as the desired flange width, from the patterned features; etc.). The spacer material is preferably removed using a patterned etching process, such as plasma etching (e.g., inductively-coupled plasma etching), but can additionally or alternatively be removed via laser micromachining and/or in any other suitable manner.

Separating the spacer from the fabrication substrate preferably includes performing a release process (e.g., by a dry etch method, such as $XeF_2$ etching; by a wet etch method; etc.). However, the spacer can additionally or alternatively be separated from the fabrication substrate mechanically and/or in any other suitable manner.

Assembling the system can include placing the spacer on the inner surface of a first electrode, then placing the inner surface of a second electrode on the spacer, opposing the first electrode across the spacer. In embodiments in which multiple spacers 120 are used, spacers can be placed on multiple electrodes, multiple spacers can be stacked on a single electrode, and/or the multiple spacers can be placed between the electrodes in any other suitable manner. Assembling the system can optionally include adhering the spacer to the inner surface; aligning the spacer (e.g., with features of the electrode such as wafer edges, with other spacers, etc.), such as by magnetic alignment, mechanical alignment, fluid alignment, and/or optical alignment techniques; treating (e.g., curing, heating, exposing to chemical environments, etc.) the assembled structure; removing any handling features of the spacer, such as a handling frame; and/or assembling the system in any other suitable manner.

Figure 8C:
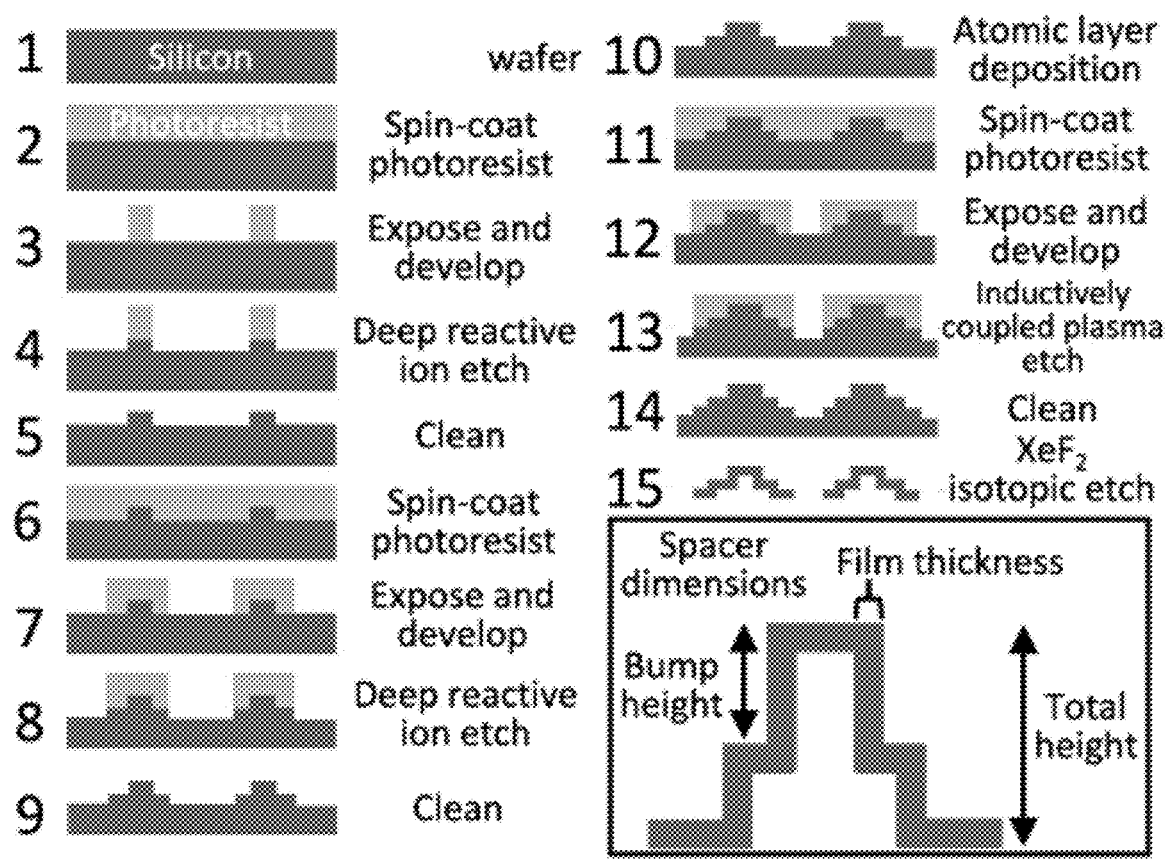
FIG. 8C is a schematic representation of a specific example of the method.

A specific example of the method is shown in FIG. 8C, wherein defining lateral features is depicted in steps 2-9 (e.g., for fabrication of spacers such as shown by way of example in FIG. 7A), depositing spacer material is depicted in step 10, selectively removing spacer material is depicted in steps 11-14, and separating the spacer from the fabrication substrate is depicted in step 15. In a first variation of this specific example, in which the spacer cross-section is substantially rectangular (e.g., does not include a U-trough), steps 6-9 may be omitted. In a second variation of this specific example, in which the fabricated spacer includes contact features that protrude in the opposite direction of the contact features depicted in FIG. 8C (e.g., protruding downward with respect to the spacer orientation shown in FIG. 8C), defining lateral features can include another iteration of etching features into the wafer (e.g., silicon wafer), wherein only regions corresponding to these contact features (and optionally, regions corresponding to portions that will be removed during selective removal of spacer material) are etched (e.g., and the remaining regions are protected by photoresist). In this example, etching features into the wafer can include: spin-coating (and/or otherwise depositing) photoresist, exposing and developing features, etching (e.g., reactive ion etching, such as deep reactive ion etching (DRIE)), and cleaning to remove photoresist; however, the wafer can additionally or alternatively be patterned in any other suitable manner.

In some embodiments, the method (and/or elements of the method) can include method elements such as those described in U.S. patent application Ser. No. 15/456,718, which is hereby incorporated in its entirety by this reference.

However, the elements of the method can additionally or alternatively be performed in any other suitable manner, and/or the method can additionally or alternatively include any other suitable elements. For example, in alternative embodiments, the method can include fabricating the spacer(s) by subtractive techniques (e.g., etching the fabrication wafer to define the spacer), fabricating the spacer(s) in place (e.g., deposited directly onto an electrode inner surface, self-assembled on the electrode inner surface, defined by etching into an electrode inner surface, etc.), and/or fabricating the spacer(s) in any other suitable manner.

We claim:
1. A thermionic energy converter system, comprising:
a first electrode comprising a first surface;
a second electrode comprising a second surface; and
a mesh spacer maintaining a gap between the first and second surfaces;
wherein:
the first and second surfaces are arranged facing each other across the gap;
the mesh spacer electrically and thermally isolates the first electrode from the second electrode;
the mesh spacer defines a mesh structure comprising a set of vertices and a set of paths connected between vertices of the set, the set of vertices comprising a first, second, and third vertex, the set of paths comprising:
a first path extending from the third vertex to the second vertex; and
a second path extending from the third vertex to the first vertex;
the mesh spacer comprises a set of legs extending substantially along the set of paths, the set of legs comprising:
a first canaliculate leg defining a first lumen extending substantially along the first path; and
a second canaliculate leg defining a second lumen extending substantially along the second path, the second leg connected to the first leg via the set of legs;
the first lumen defines a first opening facing the first surface;
the first canaliculate leg comprises a first elongated member, wherein:
the first elongated member extends substantially along the first path;
the first elongated member bounds the first lumen, opposing the first opening across the lumen; and
the second surface opposes the first lumen across the first elongated member;
the mesh spacer defines a plurality of apertures between legs of the set of legs, wherein, for each aperture of the plurality, a respective normal vector from the first surface to the second surface passes through the aperture and does not intersect the mesh spacer;
the mesh spacer contacts the first surface at a first set of contact points;
the mesh spacer defines a plurality of protrusions that protrude within the gap toward the second surface, wherein:
the plurality of protrusions comprises a first protrusion that protrudes from the first elongated member toward the second surface; and
each protrusion of the plurality contacts the second surface; and
for each contact point of the first set, a respective normal vector from the contact point to the second surface does not intersect the plurality of protrusions.
2. The system of claim 1, wherein the mesh spacer comprises an oxide material in contact with the first and second surfaces.
3. The system of claim 1, wherein a temperature difference between a first surface average temperature and a second surface average temperature is greater than 200° C.

4. The system of claim 1, wherein:
a projection of the mesh spacer onto the first surface, along a vector normal to the first surface, defines a spacer projected area;
a projection of a convex hull of the mesh spacer onto the first surface, along the vector, defines a convex hull projected area; and
a ratio of the spacer projected area to the convex hull projected area defines a fill fraction, wherein the fill fraction is less than 10%.
5. The system of claim 1, wherein:
the mesh spacer further comprises a second plurality of protrusions;
each protrusion of the second plurality protrudes within the gap toward the first surface; and
the second plurality of protrusions comprises the first set of contact points.
6. The system of claim 5, wherein:
the first protrusion is arranged proximal the first vertex; and
a second protrusion of the second plurality of protrusions is arranged proximal the first vertex.
7. The system of claim 5, wherein:
the first protrusion is arranged proximal the first vertex;
a second protrusion of the second plurality of protrusions is arranged proximal the second vertex;
no protrusion of the first plurality is arranged proximal the second vertex; and
no protrusion of the second plurality is arranged proximal the first vertex.
8. The system of claim 1, wherein the first path is substantially non-linear.
9. The system of claim 8, wherein:
the first path defines a path length between the first vertex and the second vertex;
the first vertex and second vertex are separated by a first distance; and
the path length is greater than the first distance by more than 10%.
10. The system of claim 8, wherein the first path defines a plurality of arcs.
11. The system of claim 1, wherein the first protrusion comprises a canaliculate structure defining a third lumen, the third lumen defining a third opening facing the first surface.
12. The system of claim 11, wherein:
the first canaliculate leg comprises a first flange and a first sidewall extending between the first flange and the first elongated member, wherein:
the first sidewall bounds the first lumen; and
the first sidewall defines a first sidewall height between the first flange and the first elongated member;
the first flange and the first sidewall extend substantially parallel the first elongated member; and
the canaliculate structure comprises a base member, a bridge member, and a third sidewall extending between the base member and the bridge member, wherein:
the bridge member and the third sidewall bound the third lumen;
the bridge member contacts the second surface; and
the third sidewall defines a third sidewall height between the base member and the bridge member, wherein the third sidewall height is substantially equal to the first sidewall height.
13. The system of claim 11, wherein a first cross-section of the first canaliculate leg, defined on a first plane normal the first path, is substantially identical to a protrusion cross-section of the canaliculate structure.

14. The system of claim 13, wherein the protrusion cross-section is displaced toward the second surface relative to the first cross-section.

15. A thermionic energy converter system, comprising:
- a first electrode comprising a first surface;
- a second electrode comprising a second surface; and
- a mesh spacer maintaining a gap between the first and second surfaces;

wherein:
- the first and second surfaces are arranged facing each other across the gap;
- the mesh spacer electrically and thermally isolates the first electrode from the second electrode;
- the mesh spacer defines a mesh structure comprising a set of vertices and a set of paths connected between vertices of the set, the set of vertices comprising a first, second, and third vertex, the set of paths comprising:
  - a first path extending from the third vertex to the second vertex; and
  - a second path extending from the third vertex to the first vertex;
- the mesh spacer comprises a set of legs extending substantially along the set of paths, the set of legs comprising:
  - a first leg extending substantially along the first path, the first leg comprising a first face that contacts the first surface; and
  - a second leg extending substantially along the second path, the second leg connected to the first leg via the set of legs, the second leg comprising a second face that contacts the first surface;
- the mesh spacer defines a plurality of apertures between legs of the set of legs, wherein, for each aperture of the plurality, a respective normal vector from the first surface to the second surface passes through the aperture and does not intersect the mesh spacer;
- the mesh spacer defines a plurality of protrusions that protrude within the gap toward the second surface, each protrusion of the plurality contacting the second surface; and
- a normal projection of the plurality of protrusions onto the first surface does not intersect any contact points between the mesh spacer and the first surface.

16. The system of claim 15, wherein:
- the first leg defines a lumen having an opening toward the first surface;
- the first leg comprises a bridge member and a sidewall extending between the first face and the bridge member, the bridge member and the sidewall each bounding the lumen;
- the bridge member opposes the opening across the lumen; and
- the bridge member does not contact the second surface.

17. The system of claim 15, wherein the first face is substantially planar.

18. The system of claim 15, wherein the first path is substantially non-linear.

19. The system of claim 15, wherein a temperature difference between a first surface average temperature and a second surface average temperature is greater than 200° C.

20. The system of claim 15, wherein the mesh spacer comprises an oxide material in contact with the first and second surfaces.

* * * * *